(12) United States Patent
Toyoda et al.

(10) Patent No.: US 6,847,543 B2
(45) Date of Patent: Jan. 25, 2005

(54) NON-VOLATILE MEMORY CIRCUIT, A METHOD FOR DRIVING THE SAME, AND A SEMICONDUCTOR DEVICE USING THE MEMORY CIRCUIT

(75) Inventors: Kenji Toyoda, Osaka (JP); Kiyoyuki Morita, Yawata (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 10/684,419

(22) Filed: Oct. 15, 2003

(65) Prior Publication Data

US 2004/0105301 A1 Jun. 3, 2004

(30) Foreign Application Priority Data

Jun. 5, 2002 (JP) ........................................ 2002-163927
Sep. 2, 2002 (JP) ........................................ 2002-256515

(51) Int. Cl.$^7$ ............................................... G11C 11/00
(52) U.S. Cl. ......................... 365/154; 365/156; 365/100
(58) Field of Search ................................. 365/154, 156, 365/100

(56) References Cited

U.S. PATENT DOCUMENTS

| | | | |
|---|---|---|---|
| 6,021,065 A | | 2/2000 | Daughton et al. |
| 6,111,780 A | * | 8/2000 | Bertin ......................... 365/154 |
| 6,147,922 A | | 11/2000 | Hurst, Jr. et al. |
| 6,240,013 B1 | | 5/2001 | Nishimura |
| 6,456,525 B1 | | 9/2002 | Perner et al. |

FOREIGN PATENT DOCUMENTS

| JP | 2-3180 | 1/1990 |
|---|---|---|

OTHER PUBLICATIONS

Scott Tyson, et al. "Nonvolatile, High Density, High Performance Phase–Change Memory", Aerospace Conference Proceedings, 2000 IEEE vol. 5, pp. 385–390.

* cited by examiner

*Primary Examiner*—Huan Hoang
(74) *Attorney, Agent, or Firm*—McDermott Will & Emery LLP

(57) ABSTRACT

A non-volatile memory circuit comprising first and second transistors (101, 102) each having a gate and a drain, wherein the gates of these transistors are connected to each other and the drains of these transistors are connected to each other, whereby a first inverter is formed; third and fourth transistors (103, 104) each having a gate and a drain, wherein the gates of these transistors are connected to each other and the drains of these transistors are connected to each other, whereby a second inverter is formed; a fifth transistor (105) provided with a gate, which is connected to a word line (107), and which is connected between a first bit line (108) and an input terminal of the second inverter; a sixth transistor (106) provided with a gate, which is connected to the word line (107), and which is connected between a second bit line (109) and an input terminal of the first inverter; and first and second resistor elements (114, 115) which are serially connected to the first and second inverters, respectively, wherein the input terminal and an output terminal of the first inverter are connected to an output terminal and the input terminal of the second inverter, respectively, and the resistance values of the first and second resistor elements (114, 115), which are connected to a ground line (111), are electrically variable.

7 Claims, 13 Drawing Sheets

(a)

(b)

(a)

(b)

(a)

(b)

NON-VOLATILE MEMORY CIRCUIT, A METHOD FOR DRIVING THE SAME, AND A SEMICONDUCTOR DEVICE USING THE MEMORY CIRCUIT

BACKGROUND OF THE INVENTION (1) Field of the Invention

The present invention relates to a non-volatile memory circuit, a method for driving the same, and a semiconductor device using the memory circuit. In particular, the present invention relates to a non-volatile memory circuit which is an element of a reconfigurable LSI in which circuit interconnection information is rewritable after the LSI is manufactured and retainable after power is turned off, a method for driving the same, and a semiconductor device using the memory circuit.

(2) Description of the Related Art

In recent years, new products in the electronics field have been developed with increasing speed. This has shortened the development cycle of LSIs, one of the most important components of electronic products. Developers, who create new LSI-equipped products one after another, are also demanding more functions and higher performance for LSIs. These demands have essentially shortened the product life of LSIs. Developers sometimes request changes in the specifications of LSIs after their design has been determined and manufacturing has begun. In such circumstances, it is also likely that there is not sufficient time to thoroughly check the design of the LSIs. Therefore, hardware and software containing bugs (faults) may be manufactured. Such hardware and software need to be modified.

Because of such demands, reconfigurable LSIs, such as FPGAs (Field Programmable Gate Arrays), whose circuit interconnection information can be modified after being manufactured, are attracting attention. In FPGAs, the circuit interconnection information and setting information, i.e., parameters, etc., in the look-up table (LUT) are stored in an SRAM. An SRAM loses its content when the system is turned off and power is removed. For this reason, when a system is constructed using FPGAs, a non-volatile memory, such as an EEPROM, is provided in addition to the FPGA. Circuit interconnection information and LUT parameters are stored in the non-volatile memory, and each time the system is turned on and power is supplied, they are read out from the non-volatile memory. In such a construction, after being turned on, the system cannot work until it finishes the readout of the circuit interconnection information and LUT parameters from the non-volatile memory. Therefore, such a construction is not suitable for a system which needs to work immediately after being turned on. It is also desirable to manage the power supply for every block in LSIs in order to reduce power consumption. However, in a system such as that described above, i.e., a system in which circuit interconnection information and LUT parameters must be read out each time it is turned on, power cannot be cut selectively for each block. Accordingly, it is difficult to reduce power consumption.

To solve this problem, researchers developed an FPGA with a built-in EEPROM which maintains circuit interconnection information and LUT parameters after power is removed. However, building an EEPROM in an FPGA chip involves a complicated production process and increased production costs. The EEPROM also suffers from slow rewriting operation, that is, it takes a long time for an EEPROM to rewrite data.

More recently, to overcome these problems, researchers suggested the circuit shown in FIG. 20 (T. Miwa et al., Proceedings of Symposium on VLSI Circuits (2001)). This circuit achieves non-volatility by adding two ferroelectric capacitors to a conventional SRAM which comprises six transistors as shown in FIG. 19. The circuit of FIG. 20 comprises first, third, fifth and sixth N-type transistors (951, 953, 955, and 956), second and fourth P-type transistors (952 and 954), which form a conventional SRAM, and first and second ferroelectric capacitors (964 and 965). One of these capacitors is inserted between a first node 962 and a ferroelectric polarization control line 966, and the other is inserted between a second node 963 and the ferroelectric polarization control line 966. The first node 962 and second node 963 are the memory nodes of the SRAM. Before the circuit shown in FIG. 20 is turned off, a predetermined pulse voltage is applied to the ferroelectric polarization control line 966. This causes the two ferroelectric capacitors 964 and 965 to have polarization directions opposite to each other. When the circuit is turned on, the voltage of a power line 960 is gradually increased in a period of $\mu$s order or sub $\mu$s order. At this time, the voltages of the first node 962 and second node 963 increase gradually as the voltage of the power line 960 increases. One of the ferroelectric capacitors 964 and 965 needs a higher electric charge than the other because of the polarization reversal of the ferroelectric capacitor. This makes the increasing rates of the voltage of the first node 962 and second node 963 different. Once the voltages of the first node 962 and second node 963 become different, the voltages of those nodes change as follows: the voltage of the node which is increased more quickly rises to the supply voltage level of the power line 960, while the voltage of the other node drops to the ground voltage level of a ground line 961 and they stabilize. In other words, a predetermined pulse voltage is applied to the ferroelectric polarization control line 966 before the circuit is turned off, whereby the data stored in the SRAM at this point are maintained as the polarization state of the first and second ferroelectric capacitors 964 and 965. Upon power-up, this enables the SRAM to recall the data that was stored in the memory before the circuit was turned off. After that, the circuit shown in FIG. 20 operates in a manner similar to a usual SRAM, and the first and second ferroelectric capacitors 964, 965 do not directly participate in the reading or writing control of memories.

However, the above-mentioned prior art has the following problems: firstly, the leakage current from memory cells is increased while on standby. Generally ferroelectric substances tend to be good conductors of leakage current. While power is on, because of the characteristics of SRAMs, either the first node 962 or the second node 963 maintains the supply voltage, and the other maintains the ground voltage. Therefore, the supply voltage is always applied between both ends of the two ferroelectric capacitors 964 and 965 which are connected serially via the ferroelectric polarization control line 966, that is, between the first, and second nodes 962 and 963. This is a cause of the increase in leakage current when memory cells are on standby. Although one of the major features of SRAMs is their low leakage current while on standby, this feature may be lost in the circuit of FIG. 20.

Secondly, there is a problem of increased power consumption when data are written to and read from memory cells. As mentioned above, the two ferroelectric capacitors 964 and 965 are connected between the first and second nodes 962 and 963 via the ferroelectric polarization control line 966. Therefore, these ferroelectric capacitors 964 and 965 write to and read from memory cells using a first bit line 955 and second bit line 956 which has a voltage level opposite to the bit line 955. At this time, because the capacitors serve as parasitic capacitance, an additional electric charge is necessary. This increases the power consumption when data are written to and read from the memory cells.

BRIEF SUMMARY OF THE INVENTION

An object of the present invention is to overcome the above-mentioned problems by providing a non-volatile memory circuit which can maintain the setting information such as circuit interconnection information and LUT parameters when power is removed, while reducing leakage current when memory cells are on standby and avoiding increased power consumption when data are written/read, a method for driving the same, and a semiconductor device using the memory circuit.

The non-volatile memory circuit of the present invention, which attains the above-mentioned object, comprises: a first inverter which comprises a first transistor and a second transistor each having a gate and a drain, the gates of said first and second transistors being connected to each other, and the drains of said first and second transistors being connected to each other with a first node therebetween; a second inverter which comprises a third transistor and a fourth transistor each having a gate and a drain, the gates of said third and fourth transistors being connected to each other, and the drains of said third and fourth transistors being connected to each other with a second node therebetween; a fifth transistor which comprises a gate and is connected between a first bit line and said first node, said gate being connected to a word line; and a sixth transistor which comprises a gate and is connected between a second bit line and said second node, the gate being connected to said word line; said first node being connected to the gate of said third transistor and to the gate of said fourth transistor; said second node being connected to the gate of said first transistor and to the gate of said second transistor; the source of said first transistor and the source of said third transistor being connected to a ground line; the source of said second transistor and the source of said fourth transistor being connected to a power line; the circuit further being provided with a first resistor element and a second resistor element whose resistance values can be electrically modified; the positional relationship of said first resistor element and said second resistor element being selected from the following first to fourth positional relationships:

a first positional relationship in which said first resistor element is connected between the source of said first transistor and said ground line, and said second resistor element is connected between the source of said third transistor and said ground line;

a second positional relationship in which said first resistor element is connected between the source of said second transistor and said power line, and said second resistor element is connected between the source of said fourth transistor and said power line;

a third positional relationship in which said first resistor element is connected between said first node and the drain of said first transistor, and said second resistor element is connected between said second node and the drain of said third transistor; and a fourth positional relationship in which said first resistor element is connected between said first node and the drain of said second transistor, and said second resistor element is connected between said second node and the drain of said fourth transistor. Herein, the word "connection" refers not only to a direct connection but also to an indirect connection where an intermediate element is present in between.

The method for driving a non-volatile memory circuit of the present invention drives the above-mentioned circuit of the invention and achieves the above-mentioned object. More specifically, the method comprises: a STORE step including a first step in which the resistance values of said first and second resistor elements are reduced to low levels before power to said non-volatile memory circuit is removed; and a second step, which follows said first step, and in which the resistance value of one of said first and second resistor elements is increased to a high level; and a RECALL step in which voltages are applied to said word line, said first and second bit lines and said power line at a predetermined time after the power supply to said non-volatile memory circuit is started.

A first semiconductor device using the non-volatile memory circuit of the present invention, which achieves the above-mentioned object, employs the above-mentioned non-volatile memory circuit of the present invention as a memory for parameters of a look-up table.

A second semiconductor device using the non-volatile memory circuit of the present invention, which achieves the above-mentioned object, employs the above-mentioned non-volatile memory circuit of the present invention as a memory for controlling circuit interconnection information.

A third semiconductor device using the non-volatile memory circuit of the present invention, which achieves the above-mentioned object, is provided with the above-mentioned non-volatile memory circuit of the present invention, and is used for encryption.

DETAILED DESCRIPTION OF THE INVENTION

Figure 1:
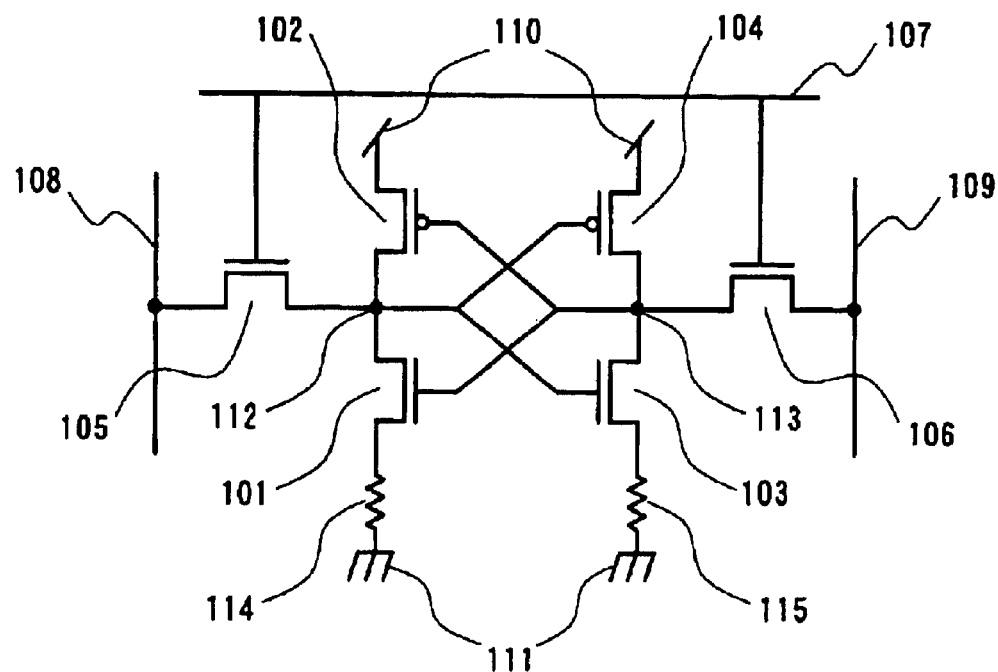
FIG. 1 is a circuit diagram of the non-volatile memory circuit according to an embodiment of the present invention.
Figure 19:
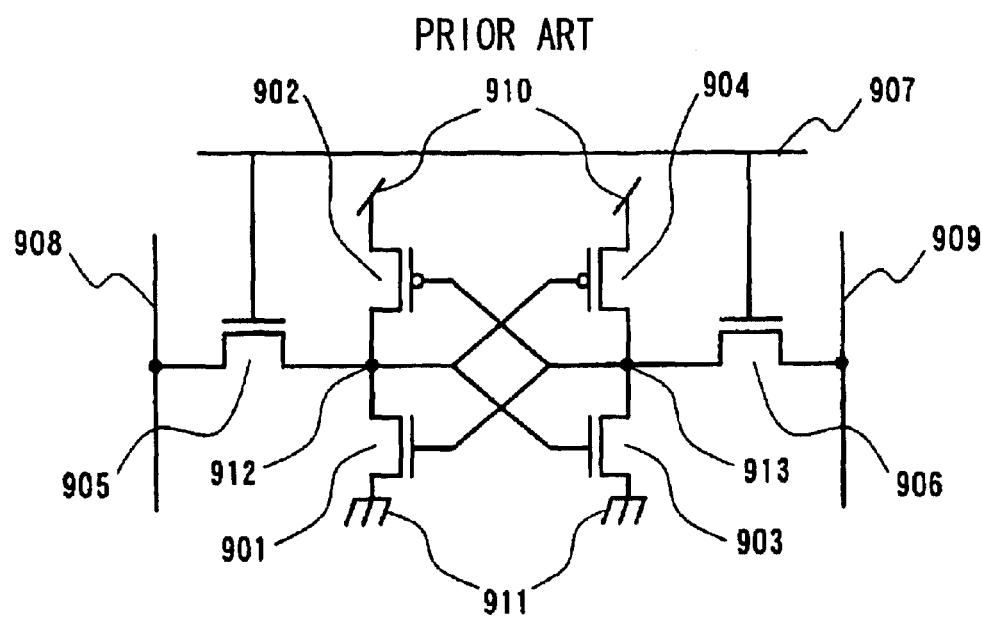
FIG. 19 is a circuit diagram of a conventional SRAM.
Figure 20:
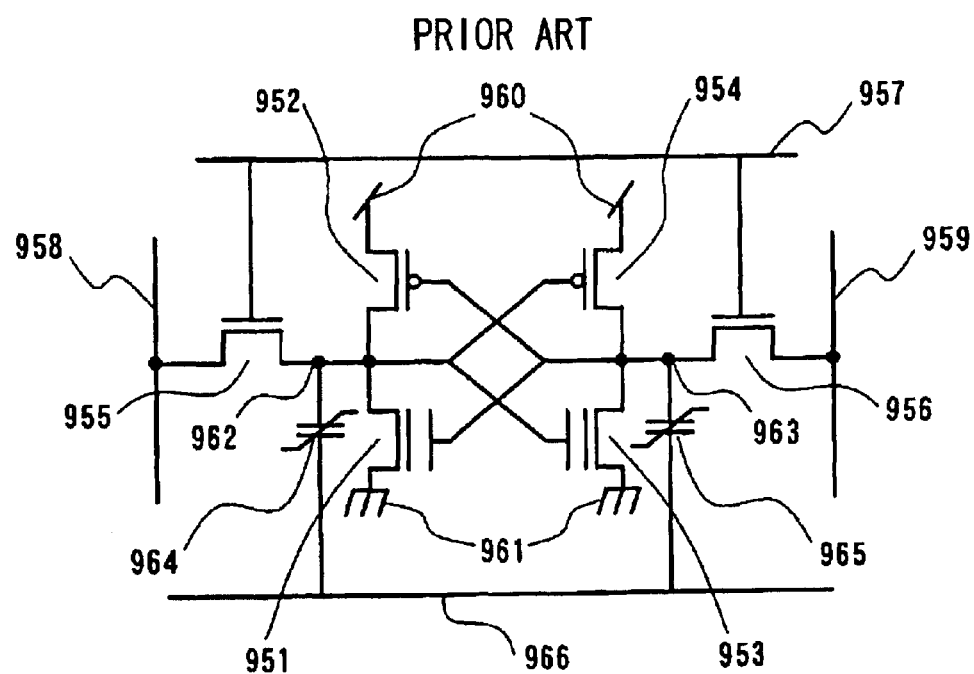
FIG. 20 is a circuit diagram of a conventional SRAM which has a ferroelectric substance.

Embodiments of the semiconductor device according to the present invention will be described below referring to the accompanying drawings. FIG. 1 is a circuit diagram of the non-volatile memory circuit according to an embodiment of the present invention. This circuit comprises a first transistor 101 and a second transistor 102 which form a first inverter, a third transistor 103 and a fourth transistor 104 which form a second inverter, a fifth transistor 105 and sixth transistor 106 which are pass transistors, a word line 107, a first bit line 108, a second bit line 109, a power line 110, a ground line 111, a first resistor element 114 and a second resistor element 115. The first and second transistors 101 and 102, which form the first inverter, complement each other, and so do the third and fourth transistors 103 and 104, which form the second inverter. Described below is the case where the first, third, fifth and sixth transistors 101, 103, 105 and 106 are N-type transistors, while the second and fourth transistors 102 and 104 are P-type transistors. The gates (the input terminal of the second inverter) of the third and fourth transistors 103 and 104, which are connected to each other, are connected to a first node 112 (the output terminal of the first inverter), which connects the drains of the first and second transistors 101 and 102. The gates (the input terminal of the first inverter) of the first and second transistors 101 and 102, which are connected to each other, are connected to a second node 113 (the output terminal of the second inverter), which connects the drains of the third and fourth transistors 103 and 104. These elements construct a flip-flop circuit. A difference between the circuit shown in FIG. 1 and a conventional SRAM (FIG. 19) is the arrangement of the first and second resistor elements 114 and 115. That is, the first resistor element 114 is positioned between the source of the first transistor 101 and the ground line 111, and the second resistor element 115 is between the source of the third transistor 103 and the ground line 111. In this circuit, the first and second resistor elements 114 and 115 are variable resistor elements whose resistance values can be changed after they are manufactured. For example, they are variable resistor elements which use phase-change materials of chalcogenide compounds, such as GeSbTe, or elements whose resistance values can be changed by the application of a magnetic field, such as GMR (Giant Magnetic Resistance) or TMR (Tunneling Magnetic Resistance) elements.

Next, the non-volatility, that is, the function to maintain data after power is removed, of the non-volatile memory circuit shown in FIG. 1 will be described. Only a summary is provided here and the details will be given later. The non-volatile function of the non-volatile memory circuit shown in FIG. 1 is achieved in the following manner: data is stored in the resistor element immediately before power is removed (hereinafter denoted as STORE control); and then the original data is recalled immediately after power is applied (hereinafter denoted as RECALL control). Firstly, in STORE control, the resistance value of one of the first and second resistor elements 114 and 115 is made higher than that of the other. This step is performed by using a predetermined means corresponding to the variable resistor elements used as the first and second resistor elements 114 and 115. The varied resistance value of each variable resistor element is maintained. For example, assume that the resistance value of the second resistor element 115 is changed to twice as high as that of the first resistor element 114. Next, in RECALL control, the voltage of the word line 107 is reduced to a low level (usually 0 V) to eliminate the influence from the first and second bit lines 108 and 109. Thereafter, the voltage of the power line 110 is slowly increased from 0 V. Since the first resistor element 114 is connected between the source of the first transistor 101 and the ground line 111, and the second resistor element 115 is connected between the source of the third transistor 103 and the ground line 111, when current begins to flow through the first and third transistors 101 and 103, the source voltages of the first and third transistors 101 and 103 rise due to voltage drops across the first and second resistor elements 114 and 115. As a result, the apparent threshold voltage (Vt) of the first and third transistors 101 and 103 increases. Since the resistance value of the second resistor element 115 is assumed to be twice as high as that of the first resistor element 114, the source potential of the third transistor 103 becomes higher than the source potential of the first transistor 101. Accordingly, the third transistor 103 comes to allow less current flow than the first transistor 101. Therefore, the current passing through the first transistor 101 makes the voltage of the first node 112 as low as the ground voltage. Since the first node 112 is electrically connected to the gate of the third transistor 103, the third transistor 103 comes to allow even less current flow. Eventually, the voltage of the first node 112 reaches the ground voltage, while the voltage of the second node 113 reaches the supply voltage, and they stabilize. Thus, if the resistance value of the second resistor element 115 is higher than that of the first resistor element 114, the voltage of the first node 112 reaches the ground voltage, while the voltage of the second node 113 reaches the supply voltage. Therefore, setting the resistance values of the resistor elements 114 and 115 in a certain (higher or lower) relation immediately before power is removed can give memory cells specific values decided by the above described effects after power is supplied. Hence, the non-volatile memory circuit shown in FIG. 1 has a non-volatile function.

Figure 2:
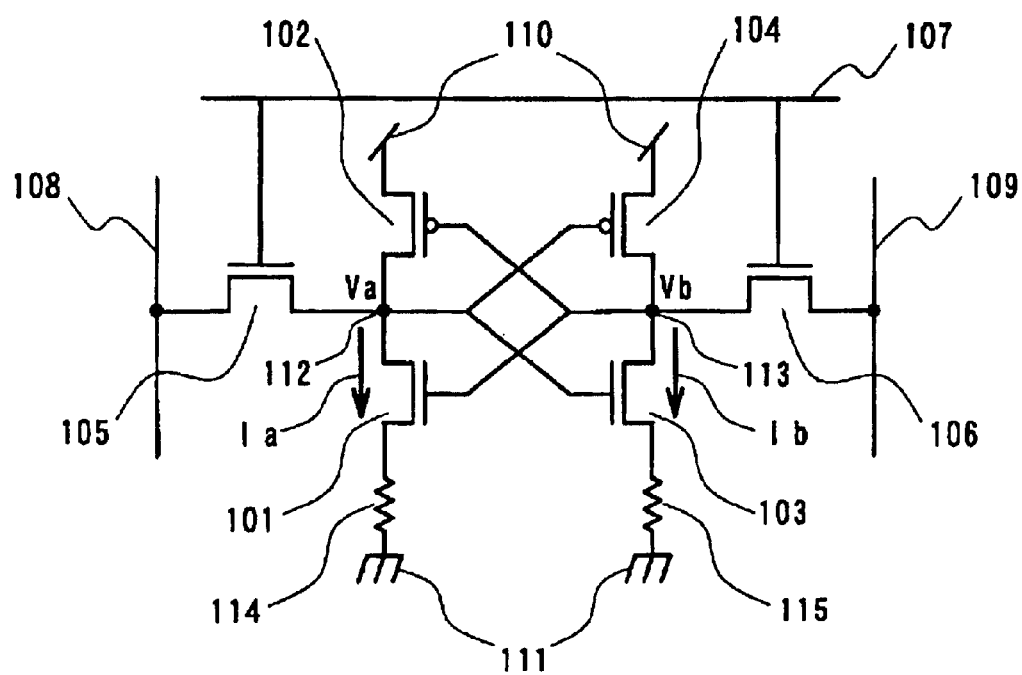
FIG. 2 is a circuit diagram for illustrating the method for driving the non-volatile memory circuit shown in FIG. 1.
Figure 3:
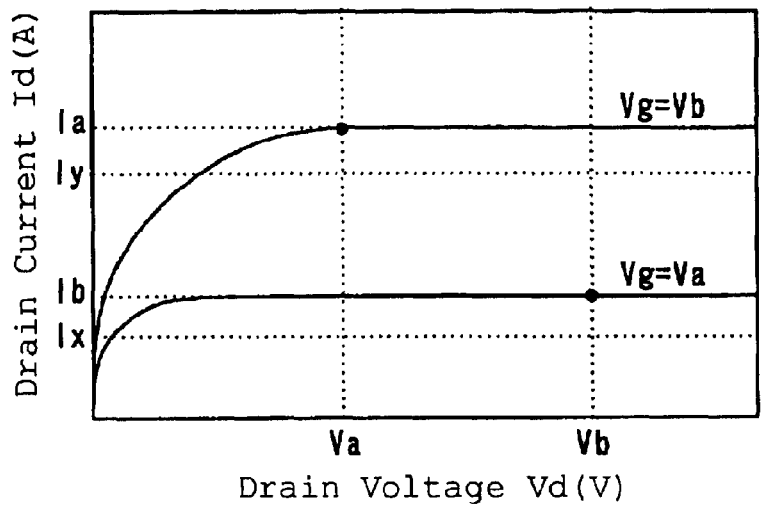
FIG. 3 is a graph showing the current-voltage characteristics of the transistors used for the non-volatile memory circuit shown in FIG. 1.
Figure 3:
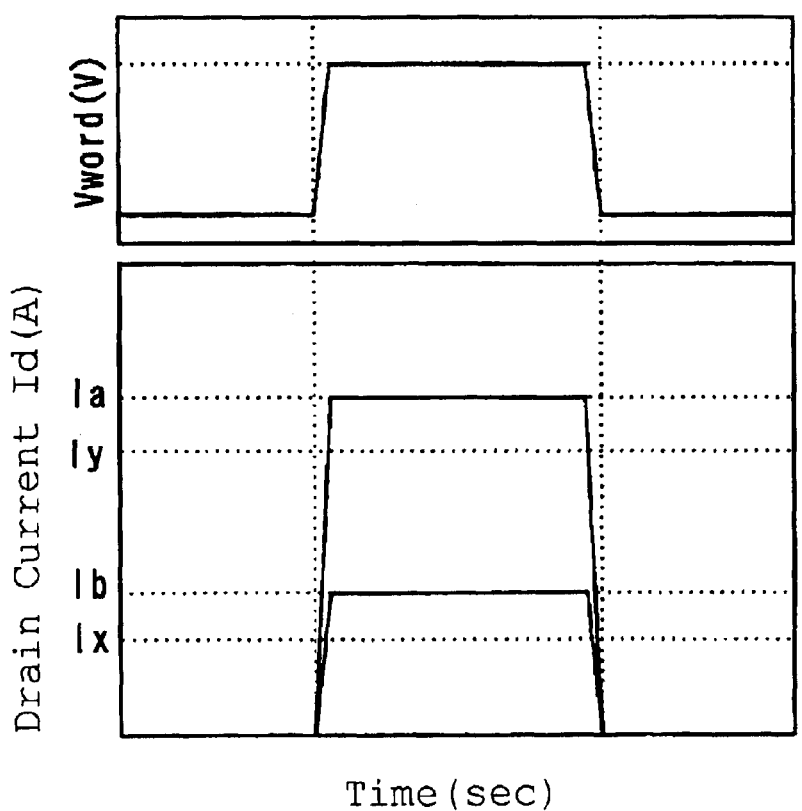

The above-mentioned STORE control varies depending on the kind of variable resistor elements used as the first and second resistor elements 114 and 115. For example, a circuit in which first and second resistor elements 114 and 115 comprising a phase-change material such as GeSbTe are used as variable resistor elements will be explained with reference to FIGS. 2 and 3. FIG. 2 shows the non-volatile memory circuit of FIG. 1, in which some voltages and currents during STORE control are additionally shown. FIG. 3(a) shows drain current-drain voltage (Id–Vd) characteristics of the first and third transistors 101 and 103. FIG. 3(b) shows the application timing of pulse voltage Vword to the word line 107 during STORE control, and the amounts of the drain currents Ia and Ib of the first and third transistors 101 and 103. First, to eliminate the influence of the second transistor 102 and the fourth transistor 104, power to the power line 110 is removed, and the voltage of the word line 107 is reduced to a low level (usually 0 V). Next, the voltage Va is applied to the first bit line 108, and at the same time the voltage Vb is applied to the second bit line 109, and then the word line 107 is increased to a high level. By these operations, the gate voltages Vg of the first and third transistors 101 and 103 are set to Va and Vb, respectively. The voltage applied to the word line 107 may be the supply voltage, or, in order to avoid the substrate bias effect in the fifth and sixth transistors 105 and 106 which use the word line 107 as their gate electrodes, may be a voltage higher than the voltages of the first and second bit line 108 and 109, Va and Vb. When the voltage of the word line 107 is increased to a high level, the voltage Va is applied to the first node 112, and the voltage Vb is applied to the second node 113. Therefore, in the first transistor 101, the gate voltage Vg becomes as high as Vb and the drain voltage Vd as high as Va. In contrast, in the third transistor 103, the gate voltage Vg becomes as high as Va and the drain voltage Vd as high as Vb. The Id–Vd characteristic shown in FIG. 3(a) indicates that current Ia flows in the first transistor 101, and current Ib flows in the third transistor 103. Since the first and second resistor elements 114 and 115 comprise a phase-change material such as GeSbTe, resistance changes according to the current value applied and its change patterns. Specifically, a phase-change material can be made highly resistive by applying, then suddenly disconnecting, a current that is higher than reset current Iy. This sudden disconnection quickly cools the material and renders it amorphous. In contrast, applying a current that is higher than or equal to set current Ix but lower than reset current Iy and gradually reducing the current allows the material to cool slowly and crystallize, thereby rendering the material poorly resistive. The phase-change material then maintains that state. Therefore, the first resistor element 114 can be made highly resistive and the second resistor element 115 poorly resistive by the following operations: voltage Va is set so that current Ia which is higher than reset current Iy flows in the first transistor 101; voltage Vb is set so that current Ib which is higher than set current Ix but lower than reset current Iy flows in the third transistor 103; and the pulse voltage Vword is applied to the word line 107.

Figure 4:
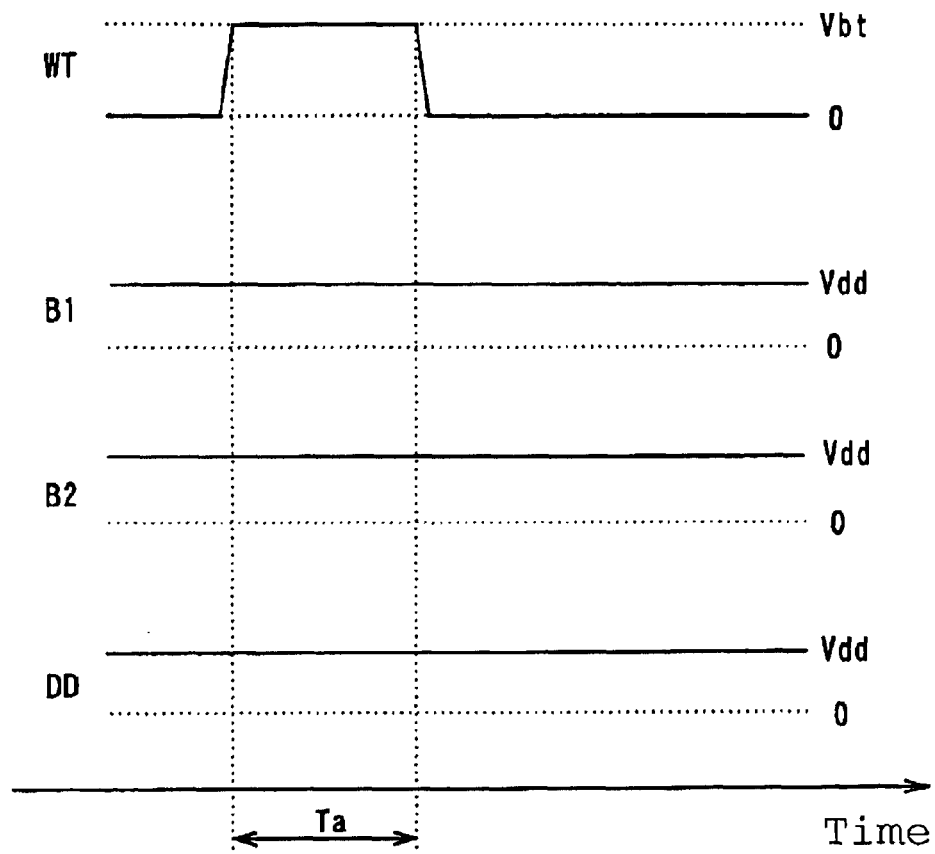
FIG. 4 is a timing chart of the first step in the STORE control of the non-volatile memory circuit shown in FIG. 1.

Next, a method for driving the non-volatile memory circuit shown in FIG. 1 will be explained in detail. This driving method includes STORE control and RECALL control, as described above. In the following, the first and second resistor elements 114 and 115 are assumed to comprise a phase-change material of a chalcogenide compound such as GeSbTe.
(STORE Control)
First, the details of STORE control will be explained. STORE control contains two steps. In the first step, both the first and second resistor elements 114 and 115 are crystallized and made poorly resistive. In the second step, either the first resistor element 114 or the second resistor element 115 is made amorphous and thus highly resistive. By these two steps, the information stored in the non-volatile memory circuit, i.e., the voltage states of the first and second nodes 112 and 113, which are memory nodes, is maintained in the form of the resistance values of the first and second resistor elements 114 and 115.
(First Step)
FIG. 4 is a timing chart for voltage applied to each line of the non-volatile memory circuit shown in FIG. 1 in the first step of STORE control. WT, B1, B2 and DD represent the voltages of the word line 107, the first bit line 108, the second bit line 109, and the power line 110, respectively. With supply voltage Vdd applied to the first bit line 108, the second bit line 109 and the power line 110, high-level voltage Vbt, which turns on the fifth and sixth transistors 105 and 106, is applied to the word line 107 (WT=Vbt). The voltage Vbt may be higher than the supply voltage Vdd. This state is maintained for time Ta. Then, the voltage WT=Vbt of the word line 107 is rapidly returned to a level such that the fifth and sixth transistors 105 and 106 are turned off, for example, 0 V. Accordingly, the fifth and sixth transistors 105 and 106 are turned on, and the voltages of the first and second nodes 112 and 113 are increased to approximately the supply voltage Vdd. This turns on the first and third transistors 101 and 103, and current flows to the first and second resistor elements 114 and 115.

As described above, phase-change materials are crystallized and made poorly resistive when they are subjected to a certain amount of Joule heat and then gradually cooled. For example, it is known that the amount of Joule heat per unit volume necessary to crystallize a phase-change material with a 190-nm diameter using $SiO_2$ as an insulated film is about 1.6 pJ (S. Tyson et al., Aerospace Conference Proceedings, 2000 IEEE vol. 5 pp 385–390).

For example, a simulation was performed in the non-volatile memory circuit shown in FIG. 1 under the following conditions to analyze the first step: the voltage WT=Vbt applied to the word line 107 was 3.9 V; time Ta to apply voltage was 100 ns; the diameters of the first and second resistor elements 114 and 115 were 190 nm; the material of the insulated films of the first and second resistor elements 114 and 115 was $SiO_2$; the initial resistance value of the second resistor element 115 was 10 times as high as that of the first resistor element 114; and the voltages were applied according to the timing chart shown in FIG. 4.

Figure 5:
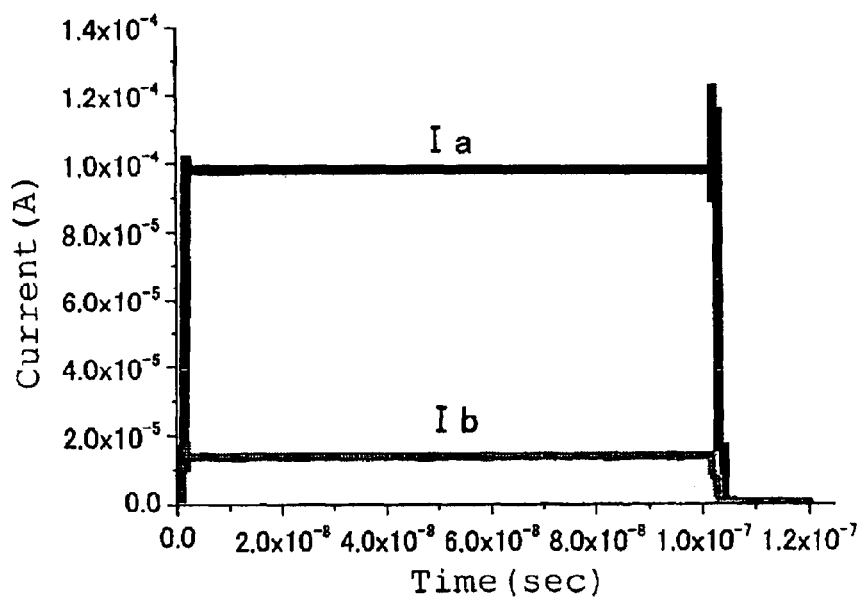
FIG. 5 shows the simulation result of the current which flows through the resistor elements in the first step of the STORE control in the non-volatile memory circuit shown in FIG. 1.

FIG. 5 is a graph showing the simulation result of the current Ia and Ib which flow to the first and second resistor elements 114 and 115, respectively. In FIG. 5, the time base (horizontal axis) sets the start time of the pulse voltage (WT=Vbt) application to the word line 107 to 0. FIG. 5 indicates that current Ia of 100 ($\mu$A) flows through the first resistor element 114, and current Ib of 17 ($\mu$A) flows through the second resistor element 115. These flows of current generate Joule heat of 11 pJ and 1.6 pJ in the first and second resistor elements 114 and 115, respectively. These heat amounts, followed by gradual cooling, are both sufficient to crystallize the phase-change material (see the above-mentioned reference of S. Tyson, et al.).

As mentioned above, in the first step of STORE control, the high voltage Vbt is applied to the word line 107 while the supply voltage Vdd is applied to the first bit line 108, second bit line 109 and power line 110, whereby the first and third transistors 101 and 103 of the non-volatile memory circuit are turned on and the amount of Joule heat necessary to change the first and second resistor elements 114 and 115 into a crystalline state (poorly resistive) can be supplied.

(Second Step)

Figure 6:
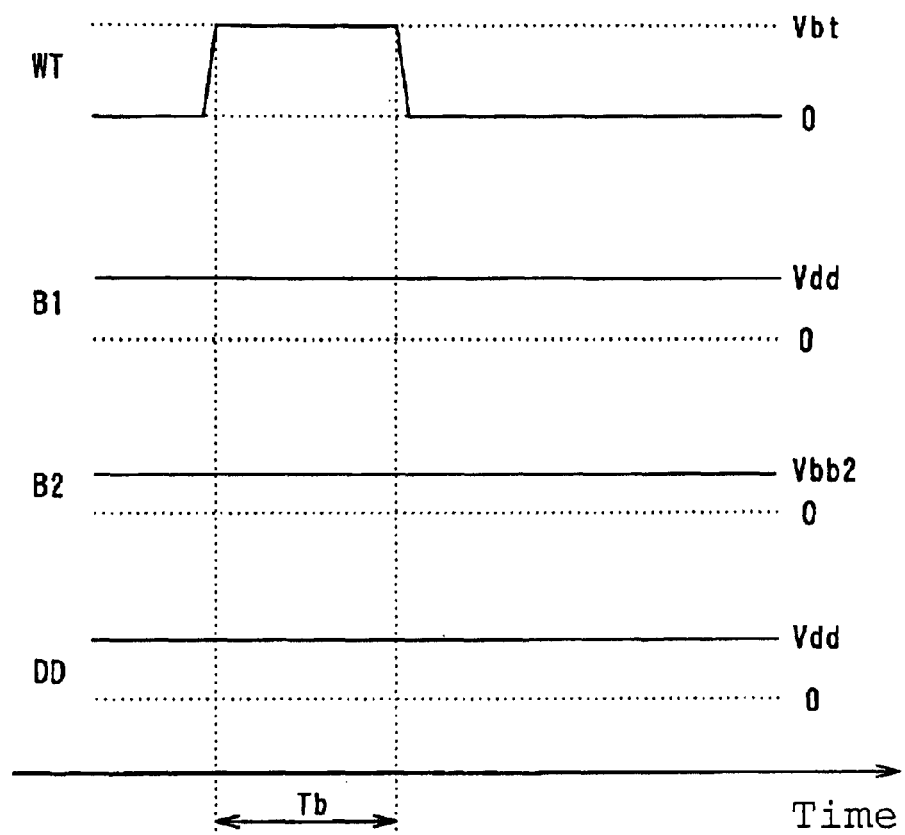
FIG. 6 is a timing chart in the second step of the STORE control of the non-volatile memory circuit shown in FIG. 1.

FIG. 6 is a timing chart for applying voltage to each line in the non-volatile memory circuit of FIG. 1 in the second step of STORE control. The meanings of the symbols are the same as in FIG. 4. It is assumed that the first and second resistor elements 114 and 115 are both in crystalline form (poorly resistive) as a result of the first step, and their resistance values are almost equal. The supply voltage Vdd is applied to the first bit line 108 and power line 110, and the voltage Vbb2, which is lower than the supply voltage Vdd, is applied to the second bit line 109. In this state, a high voltage Vbt is applied to the word line 107 (WT=Vbt). The voltage Vbt may be higher than the supply voltage Vdd. This situation is maintained during time Tb, and then the voltage WT of the word line 107 is rapidly reduced to a low level, for example, 0 V. These operations turn on the fifth and sixth transistors 105 and 106 during time Tb, increase the voltage of the first node 112 to Va at a level as high as the supply voltage Vdd applied to the first bit line 108, and increase the voltage of the second node 113 to the voltage Vb at a level as high as the voltage Vbb2 applied to the second bit line 109. Accordingly, the first and third transistors 101 and 103 are turned on, and currents (Ia and Ib respectively) flow through the first and second resistor elements 114 and 115. After time Tb elapses and WT is set to 0 again, Ia and Ib will be 0. As already stated, the phase-change material forming the first and second resistor elements 114 and 115 is changed into an amorphous state when given at least a certain amount of Joule heat to be heated to its melting point or above and cooled rapidly. Thus the transistors are made highly resistive. The Joule heat necessary to change the unit volume of a 190-nm-diameter phase-change material having an insulating layer made of $SiO_2$ into an amorphous state is about 3.6 pJ (see the above-mentioned reference of S. Tyson et al.). Therefore, current Ia needs to be higher than the reset current Iy, which is necessary to make the material amorphous, while current Ib needs to be less than the set current Ix, which is needed to make the material crystalline. To obtain these levels of current, the voltages Va and Vb generated in the first and second nodes 112 and 113 should be set appropriately. In other words, the voltages applied to the first and second bit lines 108 and 109 should be set to appropriate values. After that, currents Ia and Ib are rapidly reduced to 0. By these operations, only the first resistor element 114 can be made and kept amorphous, i.e., highly resistive, while the second resistor element 115 can be made and kept crystalline, i.e., poorly resistive.

As an example, a simulation was performed in the non-volatile memory circuit shown in FIG. 1 under the following conditions to analyze the second step: the voltage WT=Vbt applied to the word line 107 was 3.9 V; the time Tb to apply the voltage WT=Vbt was 30 ns; the voltage B1 of the first bit line 108 was the same level as the supply voltage Vdd; the voltage B2=Vbb2 of the second bit line 109 was 1.5 V; both the first and second resistor elements 114 and 115 had a resistance value of 10 kΩ immediately after the first step; and voltages were applied according to the time chart shown in FIG. 6.

Figure 7:
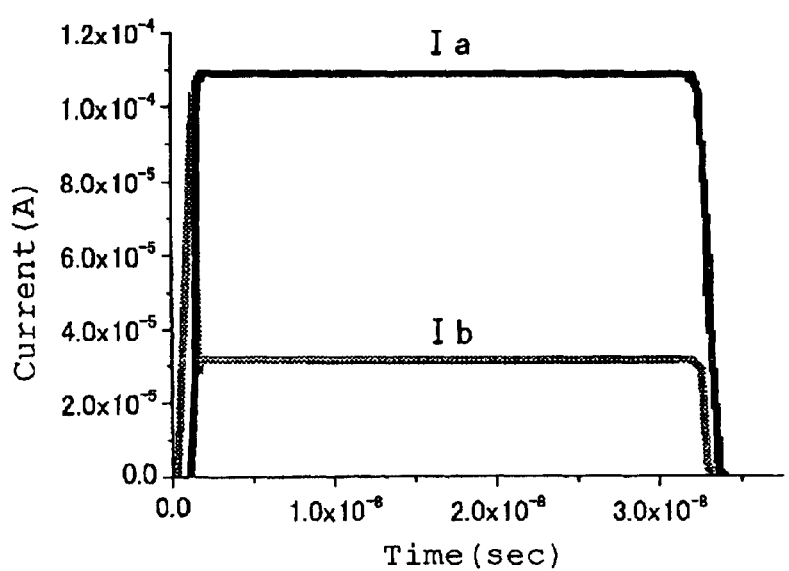
FIG. 7 shows the simulation result of the current which flows through the resistor elements in the second step of the STORE control in the non-volatile memory circuit shown in FIG. 1.

FIG. 7 is a graph which indicates the simulation results of the currents Ia and Ib flowing through the first and second resistor elements 114 and 115, like FIG. 5. FIG. 7 shows that the current Ia of 109($\mu$A) flows through the first resistor element 114, and the current Ib of 31 ($\mu$A) flows through the second resistor element 115 in a stable state. From these values, the Joule heat generated in the first and second resistor elements 114 and 115 can be calculated as 3.7 pJ and 0.35 pJ, respectively. Therefore, when the value of current flowing to the first resistor element 114 is rapidly reduced to 0, the element 114 is rapidly cooled and changed into an amorphous state (highly resistive). As opposed to this, the second resistor element 115 maintains the crystal state (poorly resistive). (See the above-mentioned reference of S. Tyson, et al.)

As mentioned above, in the second step of STORE control, the supply voltage Vdd is applied to the first bit line 108, and a voltage of 1.5 V is applied to the second bit line 109, respectively. In this state, a high voltage is applied to the word line 110. These operations turn on the N-channel MOS transistors 101 and 103 of the non-volatile memory circuit, and enable the generation of the amount of Joule heat necessary to change only the first resistor element 114 into an amorphous state.

On the contrary, the first resistor element 114 can be maintained poorly resistive (crystalline state) while the second resistor element 115 is made highly resistive (amorphous state) by the following operations: the voltage values opposite to the above are applied to the first bit line 108 and second bit line 109, that is, B1=Vbb2, and B2=Vdd; and in this state, a high pulse voltage Vbt is applied to the word line 107.

Thus, the first and second steps of STORE control enable the information stored in the non-volatile memory circuit to be maintained as the resistance values of the first and second resistor elements 114 and 115.

(RECALL Control)

Figure 8:
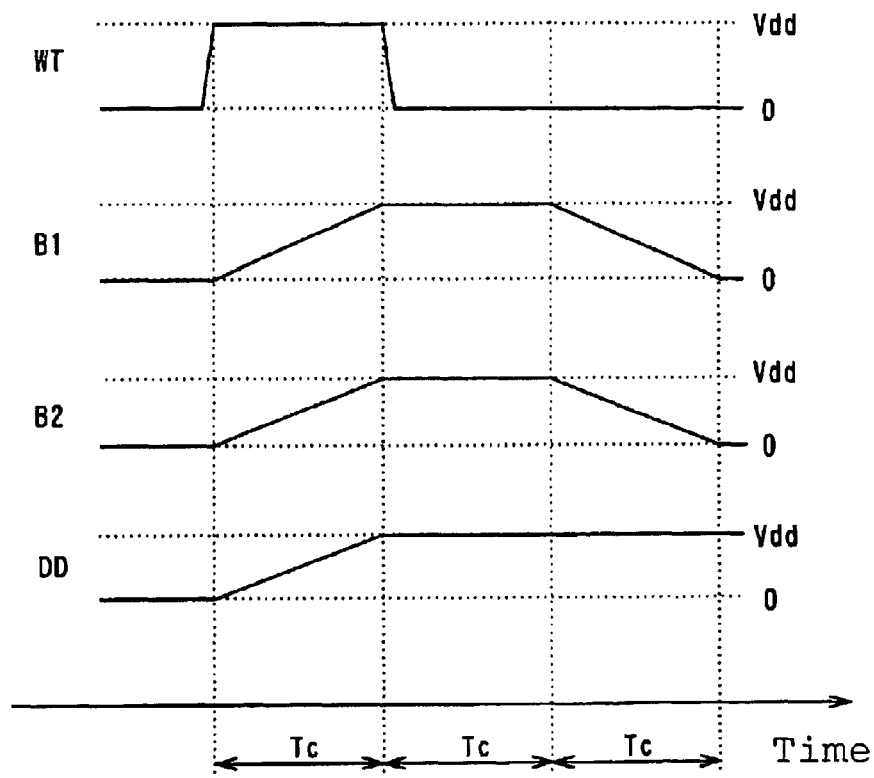
FIG. 8 is a timing chart of the RECALL control in the non-volatile memory circuit shown in FIG. 1.

Next, RECALL control will be explained with reference to FIGS. 8 and 9. In this instance, assume that the resistance of the first resistor element 114 is ten times as high as that of the second resistor element 115 as a result of the above-mentioned STORE control. FIG. 8 is a timing chart for applying voltage to each line of the non-volatile memory circuit of FIG. 1 during RECALL control. The voltage DD applied to the power line 110 is slowly increased from 0 V. When the voltage DD reaches Vdd after time Tc from when the voltage starts to rise, this state is maintained. The voltages B1 and B2 which are applied to the first and second bit lines 108 and 109, respectively, are also increased from 0 V to Vdd during time Tc at the same time as voltage DD. Meanwhile, the high voltage Vdd is applied to the word line 107 during the time Tc. By this operation, the fifth and sixth MOS transistors 105 and 106 are turned on, and the voltages of the first and second nodes 112 and 113 increase to nearly the same level as the supply voltage. Accordingly, the first and third transistors 101 and 103 are turned on, and currents flow to the first and second resistor elements 114 and 115. At this point, since the resistance value of the first resistor element 114 is ten times as high as that of the second resistor element 115, the first and third transistors 101 and 103 have different source voltages, that is, the former has a higher source voltage than the latter. Since the substrates of the first and third transistors 101 and 103 are connected to the ground line 111, the substrate bias effect occurs in the first and third transistors 101 and 103. Due to this effect, the greater the source voltage applied to the transistor, the greater the effective threshold voltage of the transistor. For this reason, under the above-mentioned conditions, the threshold voltage of the first transistor 101 will be higher than that of the third transistor 103. Accordingly, the third transistor 103 will be more easily turned on than the first transistor 101. Also, the first node 112 is maintained at a high voltage level, while the second node 113 is maintained at a low voltage level.

As an example, a simulation was performed to analyze RECALL control under the following conditions: the minimum gate length of the MOS transistors 101–106 in FIG. 1 was 0.35 μm; the supply voltage Vdd was 3.3 V; the rise time Tc of the voltage DD applied to the power line 110 when power was restored was 100 ns; the resistance value of the second resistor element 115 was 10 kΩ, which is the same level as that of the MOS transistor; the resistance value of the first resistor element 114 was 100 kΩ, which is ten times as high as that of the second resistor element 115; and voltage was applied at the timing shown in the chart of FIG. 8.

Figure 9:
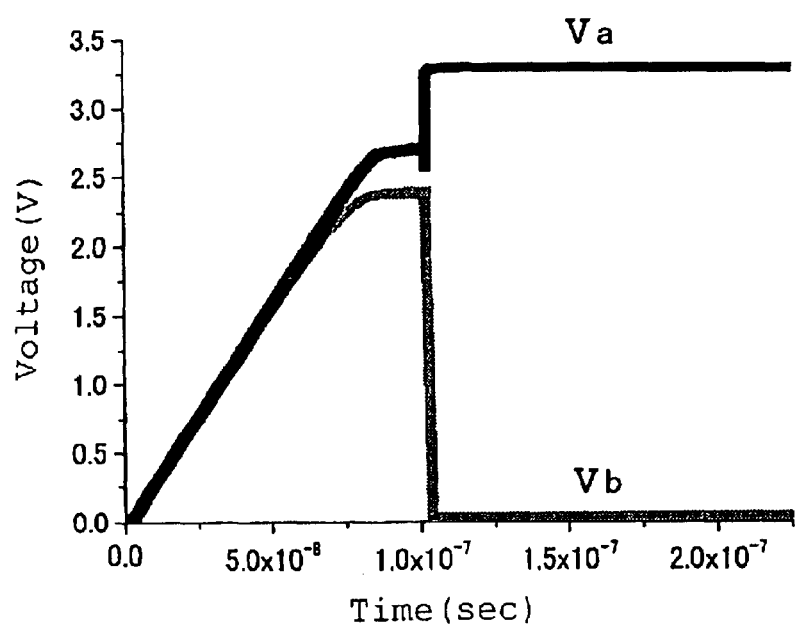
FIG. 9 shows the simulation result of the voltages at the memory nodes in the RECALL control in the non-volatile memory circuit shown in FIG. 1.

FIG. 9 is a graph showing the simulation results of the voltages Va and Vb generated in the first and second nodes 112 and 113. This graph reveals that the voltages Va and Vb of the first and second nodes 112 and 113 continue to rise in a similar manner for some time starting immediately after the beginning of the control. However, after the voltages Va and Vb increase to about 2 V, a difference occurs between the two values. About 100 ns after the start of control, the values reach a stationary state. In this state, the voltage Va of the first node 112 is the same level as the supply voltage Vdd (3.3 V), while the voltage Vb of the second node 113 is reduced to 0 V. Thus, the simulation verified the following: if there is a difference between the resistance values of the first and second resistor elements 114 and 115, either the first or third transistor 101 or 103, whichever is connected to the resistor element with the lower resistance value, is turned on first; and this determines the voltages of the first and second nodes 112 and 113. The foregoing simulation results are obtained when the resistance value of the first resistor element 114 is ten times as high as that of the second resistor element 115. However, a similar simulation performed when the resistance value of the first element 114 was about twice as high as that of the second resistor element 115 gave results similar to those shown in the graph of FIG. 9. These results show that in the non-volatile memory circuit shown in FIG. 1, the above-described RECALL control is enabled by setting the resistance ratio of the first and second resistor elements 114 and 115 to a relatively broad range of at least 2:1 to 10:1. This shows the very large margin of the resistance ratio of the first and second resistor elements 114 and 115 in the above-described RECALL control.

As mentioned above, the RECALL control of the non-volatile memory circuit according to this embodiment comprises the following procedure: the fifth and sixth transistors 105 and 106 are turned on to apply currents to the first and second resistor elements 114 and 115, which have different resistances, so that the threshold voltages of the first and third transistors 101 and 103 will be different from each other. The information stored as a difference in the resistances of the first and second resistor elements 114 and 115 is recalled as the voltages of the first and second nodes 112 and 113. In this control, the margin of the resistance ratio of the first and second resistor elements 114 and 115 is very large. Therefore, RECALL control can be performed normally unless the order of the resistance values of the first and second resistor elements 114 and 115 is reversed. This control can also operate stably even if the resistance values deviate or otherwise vary.

In the RECALL control explained above, the voltages B1, B2 and DD of the first and second bit lines 108 and 109 and the power line 110 are increased gradually. However, RECALL control is not limited to this instance and will perform as long as the threshold voltages of the first and third transistors 101 and 103 differ sufficiently for the supply voltage in the vicinity at which the non-volatile memory circuit starts operating. Therefore, the voltages B1 and B2 of the first and second bit lines 108 and 109 may be fixed at predetermined voltages, and only the voltage DD of the power line 110 may be increased gradually. Alternatively, the voltage WT of the word line 107 and the voltage DD of the power line 110 may be increased gradually. The time Tc in RECALL control is not limited to 100 ns but may be as short as 1 ns.

The non-volatile memory circuit shown in FIG. 1 performs READ operations for reading information that was stored in memory, and WRITE operations for writing information into memory during normal operation when the supply voltage Vdd is applied. A READ operation comprises the steps of turning on the pass transistors, i.e., the fifth and sixth transistors 105 and 106, and detecting the voltages of the memory nodes, i.e., the first and second nodes 112 and 113, via the first and second bit lines 108 and 109. A WRITE operation comprises the step of setting the voltages of the memory nodes, i.e., the first and second nodes 112 and 113, at predetermined voltages via the first and second bit lines 108 and 109. Since the first and second resistor elements 114 and 115 are connected to the sources of the first and third transistors 101 and 103, respectively, they do not serve as parasitic resistance in READ or WRITE operations. Therefore, there is almost no increase in power consumption.

The voltage of one of the memory nodes, either the first or second node 112 or 113 is maintained at 0 V or the supply voltage Vdd, and the other is maintained at 5 V or 0 V, respectively. For this reason, almost no short circuit current flows through the two inverters (the first transistor 101 and second transistor 102, and the third transistor 103 and fourth transistor 104). Therefore, there is almost no standby leakage current.

In a READ operation, an electric charge discharged from a load capacitor with 1-pF capacity causes current to flow from the first transistor 101 to the first resistor element 114. The Joule heat generated at this time was simulated under the same conditions as the above-mentioned simulation. The results were about 2.3 pJ when the first resistor element 114 was poorly resistive (crystalline state) and about 0.015 pJ when it was highly resistive (amorphous state). A comparison of these values and the above-mentioned Joule heat values which cause phase change (about 1.6 pJ for changing into the crystalline state and about 3.6 pJ for changing into the amorphous state) reveals that regardless of whether the resistivity of the first and second resistor elements 114 and 115 are high or low, a READ operation does not affect the state of the first and second resistor elements 114 and 115. That is, a READ operation does not change the resistance values of the first and second resistor elements 114 and 115.

As mentioned above, according to this embodiment of the non-volatile memory circuit of the present invention, two resistor elements comprising a phase-change material are changed to a crystalline state in the first step of STORE control, and only one of the two resistor elements is changed to an amorphous state in the second step. These changes enable the circuit to store information as the resistance values of the two resistor elements, thereby achieving non-volatility. In addition, this circuit is substantially free of standby leakage current. Furthermore, the power consumption of this circuit is not substantially increased during READ and WRITE operations compared to conventional SRAMs. In RECALL control, applying the voltages of the bit lines to the memory nodes can achieve very stable operation. The number of transistors is the same as in the conventional SRAM, six, and therefore there is no increase in power consumption caused by additional transistors.

Figure 10:
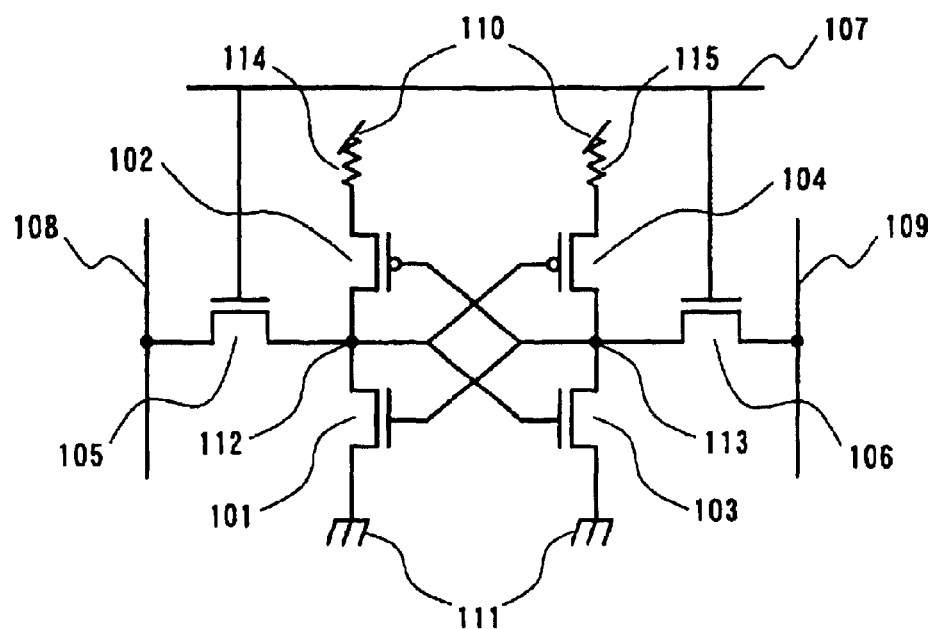
FIG. 10 is a circuit diagram of FIG. 1 in which the positions of the resistor elements are changed.

Described above is a non-volatile memory circuit where the first resistor element 114 is connected between the source of the first transistor 101 and the ground line 111, and the second resistor element 115 is connected between the source of the third transistor 103 and the ground line 111 (see FIG. 1). However, the present invention is not limited to this arrangement. For example, as shown in FIG. 10, the first resistor element 114 may be connected between the source of the second transistor 102 and the power line 110, and the second resistor element 115 may be connected between the source of the fourth transistor 104 and the power line 110. In this arrangement, as in the one described above, the source voltages of the first and second resistor elements 114 and 115 are lowered when current begins to flow through the second and fourth transistors 102 and 104 due to voltage drops across the resistor elements. Accordingly, the apparent threshold voltages (Vt) of the P-type transistors increase. Thus the voltage rise rates of the first node 112 and second node 113 will differ because of the difference in the resistance values of the first resistor element 114 and second resistor element 115. For example, assume that the resistance value of the second resistor element 115 is twice as high as that of the first resistor element 114. Under this condition, the source voltage of the fourth transistor 104 becomes lower than that of the second transistor 102 (since they are P-type, the change occurs differently from N-type). This makes current flow through the fourth transistor 104 more difficult than that through the second transistor 102. Therefore, the voltage value of the first node 112 becomes similar to the supply voltage because of the current flowing through the second transistor 102. The first node 112 is electrically connected to the gate electrode of the fourth transistor 104, which thereby becomes increasingly less conductive. Finally the voltage of the first node 112 reaches the supply voltage, on the contrary, the voltage of the second node 113 reaches the ground voltage, and the two voltages stabilize. Consequently, data of the non-volatile memory circuit after power is supplied can be determined by controlling the resistance values of the first and second resistor elements 114 and 115 as in the circuit shown in FIG. 1. That is, the non-volatile function can be imparted to the non-volatile memory circuit shown in FIG. 10. As mentioned above, in the circuit shown in FIG. 10, the difference in the voltage rise rates of the first and second nodes 112 and 113 causes the difference in the resistance values of the first and second resistor elements 114 and 115. The circuit utilizes this effect as an operating principle. Therefore, even if the resistance values of the first and second resistor elements 114 and 115 are varied, the above-mentioned non-volatile function can operate normally as long as the order of the resistance values of the first and second resistor elements 114 and 115 is maintained. This means that the non-volatile memory circuit shown in FIG. 10 is not easily susceptible to a deviation or other variation of the resistance values of the first and second resistor elements 114 and 115 because of its configuration.

The method for driving the non-volatile memory circuit shown in FIG. 10 is similar to that of the non-volatile memory circuit shown in FIG. 1 and described above, except for the voltages applied to the first bit line 108 and the second bit line 109. Specifically, the method comprises the following processes: in the first step of STORE control, the voltages of both the first and second bit lines 108 and 109 are set to 0 V. In this state, a high-level pulse voltage is applied to the word line 107. In the second step, the voltage of either the first or second bit line 108 or 109 is set to 0 V, and the voltage of the other is set higher than 0 V. In this state, a high-level pulse voltage is applied to the word line 107. The timing chart of the RECALL control is the same as that of FIG. 8.

Figure 11:
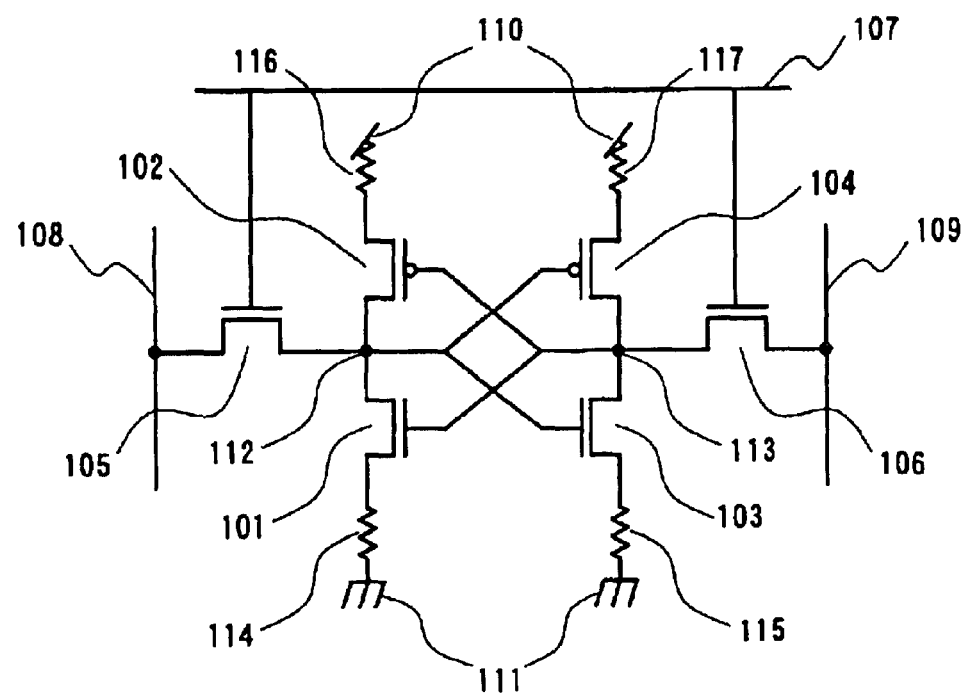
FIG. 11 is a circuit diagram of FIG. 1 in which resistor elements are further added.

In the non-volatile memory circuits shown in FIG. 1 and FIG. 10, the first and second resistor elements 114 and 115 are connected only to the sources of the first and third transistors 101 and 103, or to the sources of the second and fourth transistors 102 and 104. However, as shown in FIG. 11, the first to fourth resistor elements 114–117 may be connected to the sources of the first and third transistors 101 and 103, and the sources of the second and fourth transistors 102 and 104. The non-volatile memory circuit shown in FIG. 11 uses a low supply voltage, and the variable range of the resistance of the resistor elements is narrow. This narrow variable range is effective when a large operating margin is desired, or when there is a large deviation in transistor characteristics. In this case, the order of the resistance values of the first and second resistor elements 114 and 115 needs be opposite to that of the third and fourth resistor elements 116 and 117. For example, when the resistance value of the second resistor element 115 is set higher than that of the first resistor element 114, the resistance value of the third resistor element 116 must be set higher than that of the fourth resistor element 117.

The RECALL control of the method for driving the non-volatile memory circuit shown in FIG. 11 is the same as that of the non-volatile memory circuit shown in FIG. 1 and mentioned above. The STORE control of the method can be a combination of the STORE control of the two non-volatile memory circuits of FIGS. 1 and 10. Specifically, in the STORE control described in connection with the non-volatile memory circuit of FIG. 1, the resistance values of the first and second resistor elements 114 and 115 are set. Likewise, in the STORE control described in connection with the non-volatile memory circuit of FIG. 10, the resistance values of the third and fourth resistor elements 116 and 117 are set.

The circuits shown in FIGS. 1, 10 and 11 are CMOS type non-volatile memory circuits using both N-type transistors and P-type transistors. However, these circuits are not limited to these arrangements. For example, the second transistor and fourth transistor 102 and 104, which are P-type transistors, may be replaced with depletion type N-type transistors, high resistance elements formed with undoped polysilicon, or other elements. Alternatively, all the N-type transistors in the non-volatile memory circuit may be replaced with P-type transistors.

Figure 12:
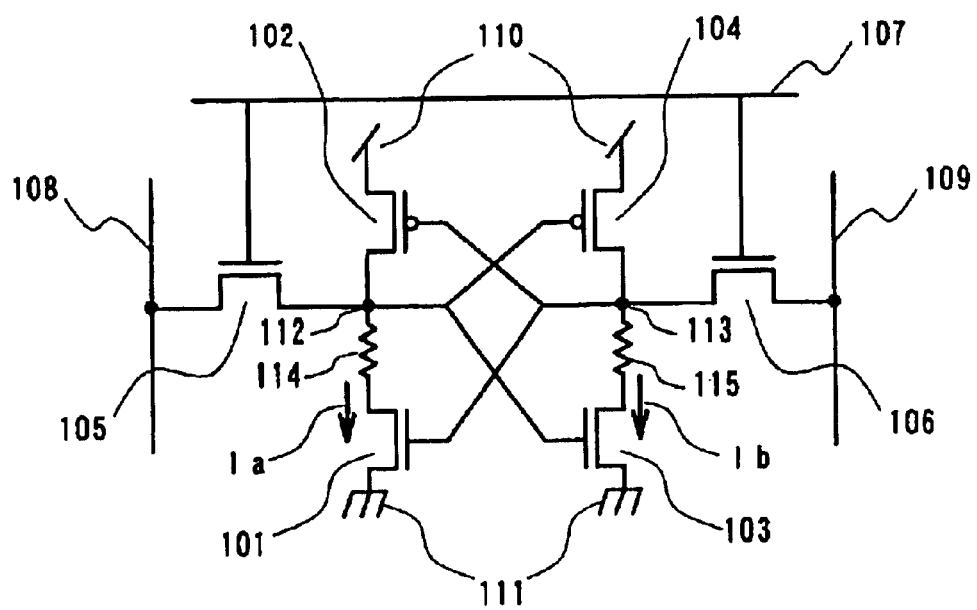
FIGS. 12(*a*) and 12(*b*) are circuit diagrams of FIG. 1 in which the positions of the resistor elements are further changed.
Figure 12:
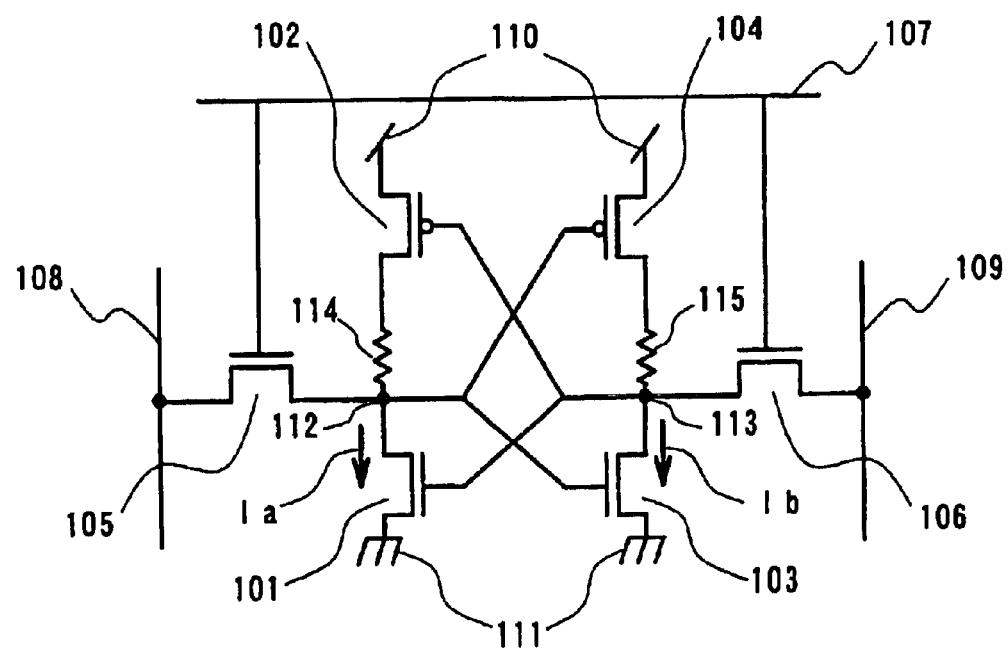

Explained above is the case where the first and third transistors 101 and 103 operate on source voltages higher than the voltage of the ground line 111 by the values of the voltage drop of the first and second resistor elements 114 and 115. However, the voltages are not limited to these. Any combination of voltages is useful as long as the following requirement is fulfilled: current greater than the reset current Iy flows through one of the first and second resistor elements 114 and 115; and current greater than the set current Ix but less than the reset current Iy flows through the other. For example, some combinations of the characteristics of the first and second resistor elements 114 and 115 and the characteristics of the first and third transistors 101 and 103 may prevent appropriate data writing to the non-volatile memory circuit shown in FIG. 1, namely STORE control. In that case, as shown in FIG. 12(*a*), it is effective to connect the first resistor element 114 between the first transistor 101 and the first node 112, and to connect the second resistor element 115 between the third transistor 103 and the second node 113. When the elements are connected in this manner and the ground line 111 is used as a source, the source voltage is not susceptible to the first and second resistor elements 114 and 115. Accordingly, current Ia and current Ib will not be very susceptible to the first and second resistor elements 114 and 115. The method for driving the non-volatile memory circuit shown in FIG. 12(*a*) is the same as that of the non-volatile memory circuit shown in FIG. 1. As shown in FIG. 12(*b*), it is also effective to connect the first resistor element 114 between the first node 112 and the second transistor 102, and to connect the second resistor element 115 between the second node 113 and the fourth transistor 104. The method for driving the non-volatile memory circuit shown in FIG. 12(*b*) is the same as that for the non-volatile memory circuit shown in FIG. 10.

Explained above is the case where a phase-change material, such as GeSbTe, is used as the first and second resistor elements 114 and 115. However, the material of these resistor elements is not limited to this. Other phase-change materials, such as chalcogenide compounds containing As, etc., may be used. Strongly correlated electron materials such as perovskites are also usable. Elements whose resistance value can be changed by the application of a magnetic field, for example, GMR elements, TMR elements and the like, may also be used.

Figure 13:
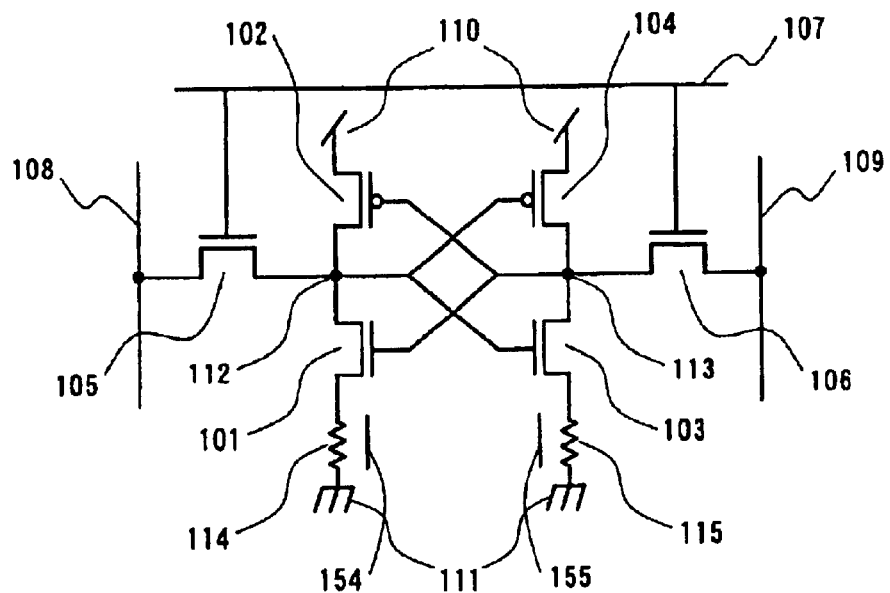
FIG. 13(a) is a circuit diagram of FIG. 1 in which TMR elements are used as resistor elements.
FIG. 13(b) is a perspective diagram schematically showing the construction in the vicinity of the resistor element.
Figure 13:
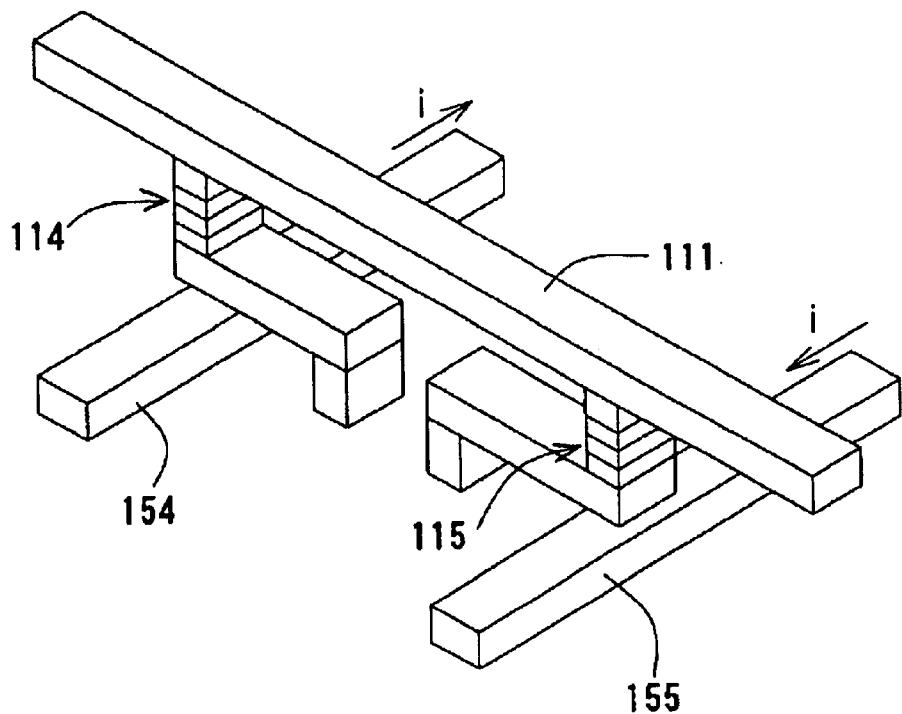

FIG. 13(*a*) is a circuit diagram of a non-volatile memory circuit using TMR elements. FIG. 13(*b*) is a perspective diagram schematically showing the 3-dimensional construction of the first and second resistor elements 114, 115, the first and second magnetic field control lines 154 and 155 and their surrounding area. FIG. 13(*b*) is positioned in the direction vertically opposite to the circuit diagram of FIG. 13(*a*). The first and second resistor elements 114 and 115 shown in FIG. 13(*b*) have a three-layer structure comprising a free magnetic layer where each spin direction is variable, a pinned magnetic layer where each spin direction is fixed in one direction, and an insulating layer sandwiched between the two magnetic layers (not shown). The spin direction in the free magnetic layer of the first and second resistor elements 114 and 115, which are TMR elements, changes depending the direction of the magnetic field applied. The resistance values of the two resistor elements changes depending on whether the spin directions in the two magnetic layers (free magnetic layer and pinned magnetic layer) are parallel or antiparallel. More specifically, for example, when currents are induced in the ground line 111 and the first magnetic field control line 154 in predetermined directions, these currents create magnetic fields. The total magnetic field formed by these magnetic fields sets the spin directions in the free magnetic layer of the first resistor element 114. If the set spin directions in the free magnetic layer of the first resistor element 114 are set parallel to those in the pinned magnetic layer, the resistance value of the first resistor element 114 becomes low. When the directions of the currents induced in the ground line 111 and the first magnetic field control line 154 are reversed, the spin directions in the free magnetic layer of the first resistor element 114 become antiparallel to those in the pinned magnetic layer. Therefore, the resistance value of the first resistor element 114 is increased. In a similar manner, the resistance value of the second resistor element 115 can be set by using the ground line 111 and the second magnetic field control line 155. Thus, the resistances of the first and second resistor elements 114 and 115 can be set to have a predetermined value order by controlling the directions of the currents induced in the ground line 111, and the first and second magnetic field control lines 154 and 155.

Figure 14:
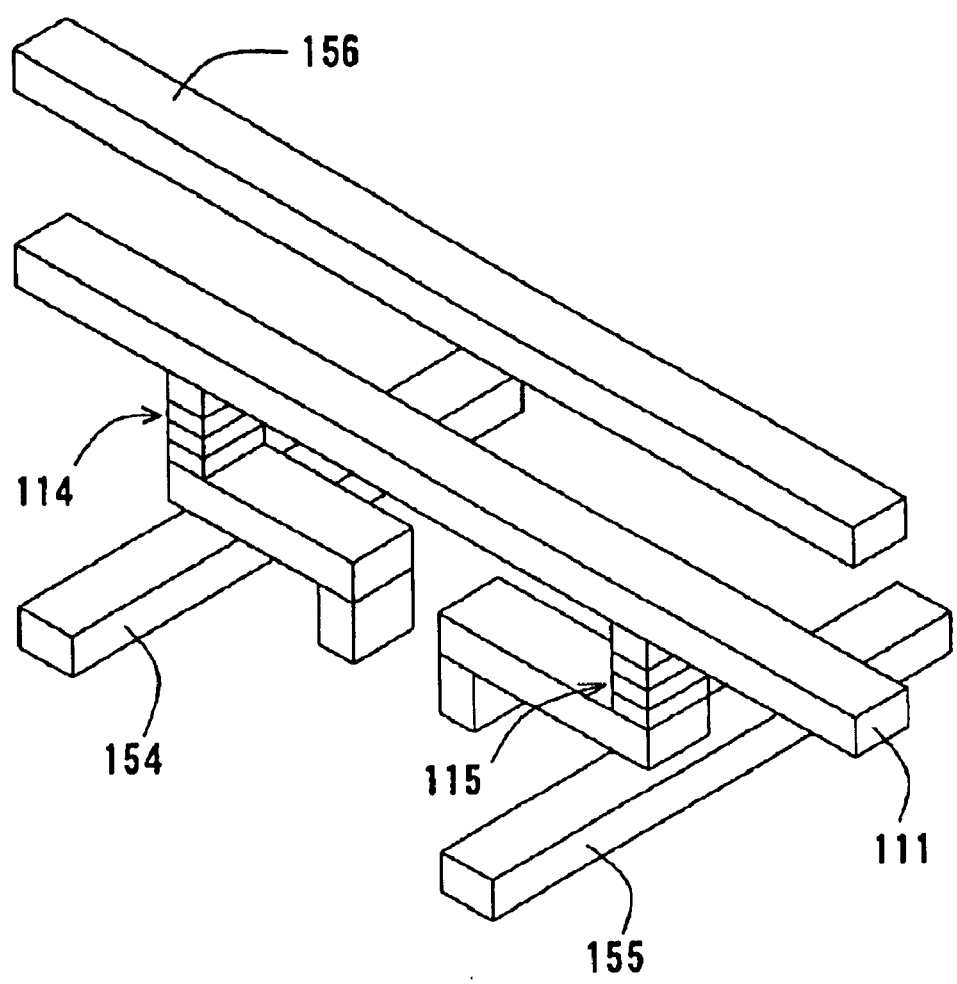
FIG. 14 is a perspective diagram schematically showing the construction in the vicinity of the resistor element of FIG. 13(a) in which a magnetic field control line is further added.

The non-volatile memory circuit shown in FIG. 13(*b*) has the first and second magnetic field control lines 154, 155 and the ground line 111 which intersects the control lines for use in magnetic field control. However, as shown in FIG. 14, the third magnetic field control line 156 may be disposed parallel to the ground line 111. When a memory cell array is constructed by using the non-volatile memory circuit shown in FIG. 14, data can be written to a certain memory cell by magnetic field control using the first to third magnetic field control lines 154–156, while simultaneously reading data from another memory cell by the word line 107, and the first and second bit lines 108 and 109.

Figure 15:
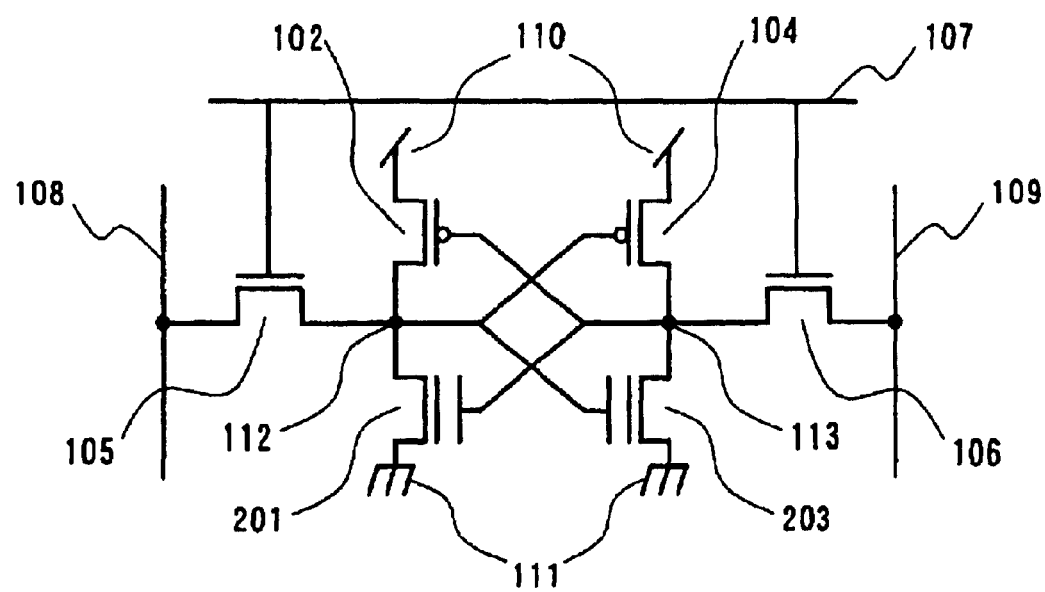
FIG. 15 is a circuit diagram of the non-volatile memory circuit shown in FIG. 1 in which the N-type transistors and resistor elements connected serially are replaced with N-type transistors each having a floating gate.

Explained above is the case where the data of the non-volatile memory circuit is recalled after power is supplied by providing the first and second resistor elements 114 and 115 and controlling their resistance values. However, the method for recalling data is not limited to this case. As long as a characteristics difference can be created between the first inverter, which comprises the first transistor 101 and second transistor 102 in FIG. 1, and the second inverter, which comprises the third transistor 103 and the fourth transistor 104, data can be recalled after power is turned on. For example, the memory circuit may have a construction as shown in FIG. 15. The circuit shown in FIG. 15 is a non-volatile memory circuit such as that in FIG. 1, in which the first transistor 101 and the first resistor element 114, as well as the third transistor 103 and the second resistor element 115, are replaced, respectively, with the first and third transistors 201 and 203 having a floating gate. This non-volatile memory circuit comprises, like conventional SRAMs, the first and third transistors 201 and 203 having a floating gate, the fifth and sixth transistors 105 and 106 and the second and fourth transistors 102 and 104. The first transistor 201 having a floating gate and the second transistor 102 form an inverter, while the third transistor 203 having a floating gate and the fourth transistor 104 form another inverter. The input terminal of each of these two inverters is connected to the output terminal of the other inverter. The effective threshold voltages of the first and third transistors 201 and 203 having a floating gate are varied when electrons are injected to the floating gates by FN (Fowler Nordheim) current, channel hot electrons (CHE) and the like. For example, when electrons are injected only into the floating gate of the first transistor 201 to increase the effective threshold voltage, the drain current which flows through the first transistor 201 when the circuit is turned on becomes lower than the current which flows through the third transistor 203 having a floating gate when power is restored. Therefore, the first node 112 maintains a higher voltage than the second node 113, reaches the supply voltage and stabilizes. As a result, if the threshold voltage of the first transistor 201 is higher than that of the third transistor 203, the voltage of the second node 113 reaches the ground voltage. Meanwhile, the voltage of the first node 112 reaches the supply voltage. Thus, the data before power is removed can be recalled after power is restored by controlling the threshold voltages of the first and third transistors 201 and 203. This means that the memory circuit shown in FIG. 15 has a non-volatile function. The floating gate may be in the form of a conventional plate or dots. The floating gate may be located throughout the bottom of the control gate. Alternatively, it may be located only on the area, near the source and drain, which is necessary to control the threshold voltage.

Figure 16:
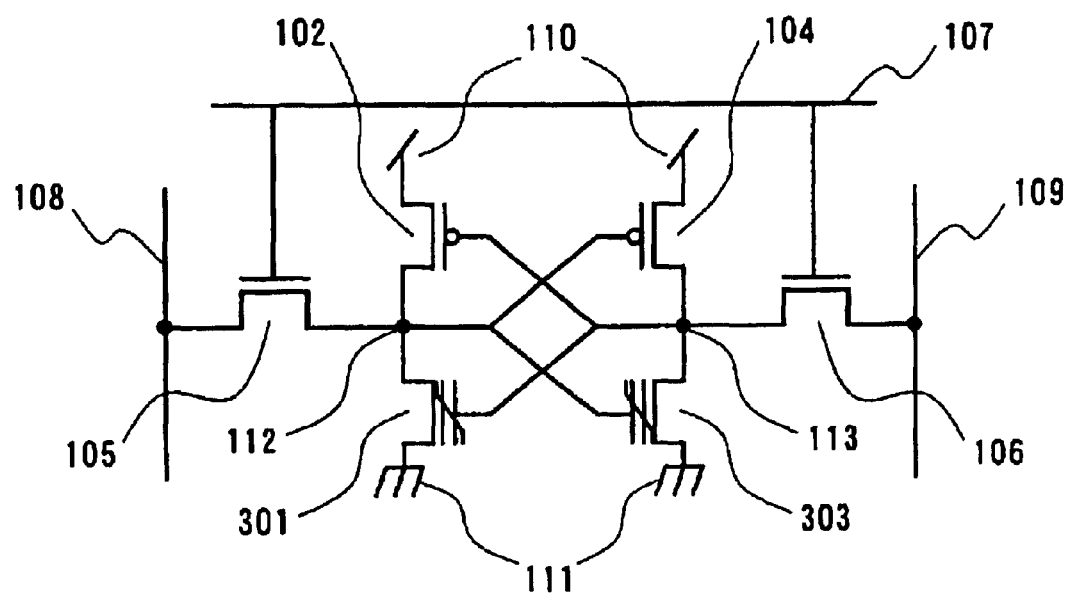
FIG. 16 is a circuit diagram of the non-volatile memory circuit shown in FIG. 1 in which the N-type transistors and resistor elements connected serially are replaced with N-type transistors each having a ferroelectric capacitor.

As shown in FIG. 16, effects similar to those mentioned above can be produced by replacing the first transistor 101 and the first resistor element 114, as well as the third transistor 103 and the second resistor element 115 in the non-volatile memory circuit of FIG. 1 with the first and third MFIS type transistors 301 and 303 having a ferroelectric capacitor above the gate, respectively. The first and third MFIS type transistors 301 and 303 may also be MFMIS type transistors.

Figure 17:
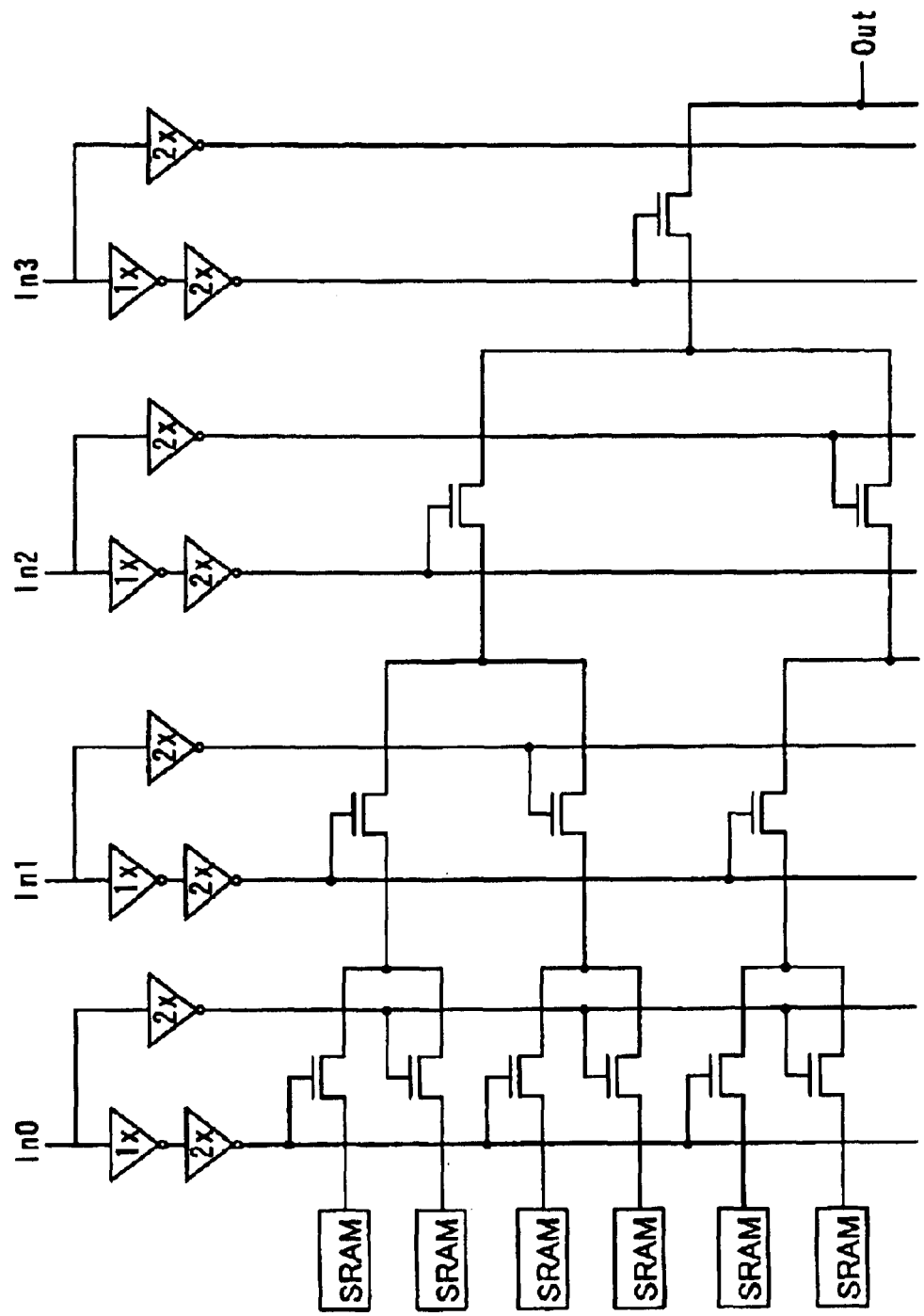
FIG. 17 is a circuit diagram of an LUT adapting the non-volatile memory circuit according to an embodiment of the present invention.
Figure 18:
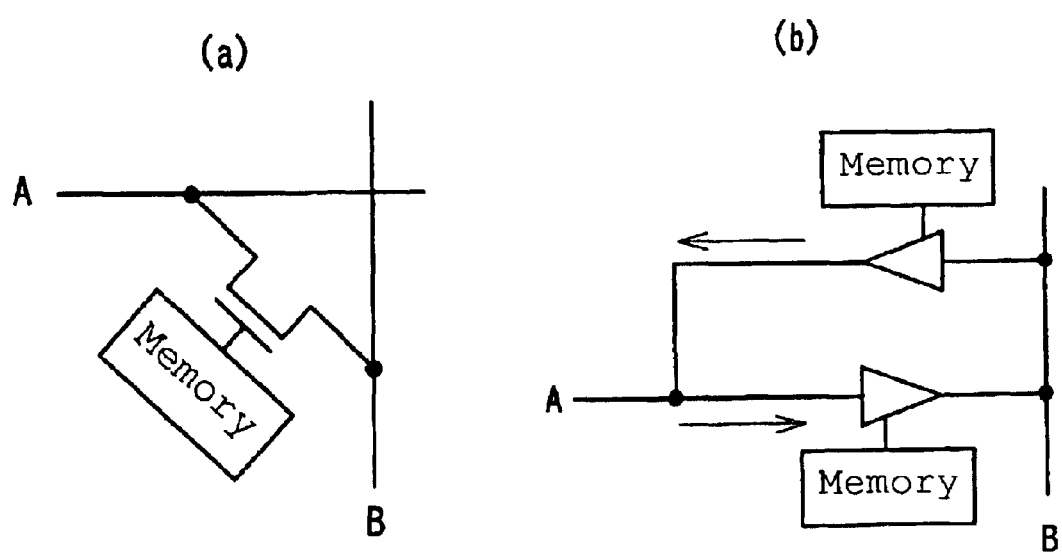
FIG. 18(a) is a circuit diagram where the non-volatile memory circuit according to an embodiment of the present invention is applied to connection control between electrical wires.
FIG. 18(b) is a circuit diagram where the non-volatile memory circuit according to an embodiment of the present invention is applied to a tri-state buffer.

The non-volatile memory circuit according to the present invention can be used for various applications. FIG. 17 shows a circuit diagram for using a non-volatile memory circuit according to the present invention as a memory for a look-up table. In the look-up table shown in FIG. 17, output signal Out is determined by selecting data stored in SRAM memory cells according to 4-bit input signals In0–In3. Using the non-volatile memory circuit of the present invention for the SRAM memory cell can impart a non-volatile function to the look-up table. The non-volatile memory circuit of the invention can also be used as a memory for circuit interconnection information in a circuit, as shown in FIG. 18(a). This drawing shows a circuit which connects and disconnects lines A and B by turning ON and OFF the pass transistor provided between these wires. In this circuit, the non-volatile memory circuit of the present invention controls the gate electrode of the pass transistor. Further, the non-volatile memory circuit of the present invention can also be used as a memory for controlling a tri-state buffer which regulates bi-directional data flows, as shown in FIG. 18(b). Therefore, in a semiconductor device using a non-volatile memory circuit according to this embodiment as a memory for a look-up table or circuit interconnection information, both circuit interconnection information and data can be modified electrically. Moreover, the circuit configuration (presence or absence of connection between wires) and memory content of such a semiconductor device cannot be recognized through observation of its appearance. Such a feature makes the semiconductor device useful for advanced encryption.

It should be noted that in the non-volatile memory circuits shown in FIGS. 1, 10, 11, 12(a) and 12(b), there are no switching elements composed of transistors or the like, between the first transistors 101 and ground lines 111 or between the third transistors 103 and the ground lines 111.

INDUSTRIAL APPLICABILITY

The present invention provides a semiconductor device which can store the contents of memory as a difference in the resistance values of two variable resistor elements, recall the contents of the memory after power is turned on, achieve a non-volatile memory circuit which is not subject to increased standby leakage current or increased power consumption during read/write operation, and maintain circuit interconnection information and the parameter set for a look-up table after power is removed.

What is claimed is:

1. A method for driving a non-volatile memory circuit comprising:
    a first inverter which comprises a first transistor and a second transistor each having a gate and a drain, the gates of said first and second transistors being connected to each other, and the drains of said first and second transistors being connected to each other with a first node therebetween;
    a second inverter which comprises a third transistor and a fourth transistor each having a gate and a drain, the gates of said third and fourth transistors being connected to each other, and the drains of said third and fourth transistors being connected to each other with a second node therebetween;
    a fifth transistor which comprises a gate and is connected between a first bit line and said first node, said gate being connected to a word line; and
    a sixth transistor which comprises a gate and is connected between a second bit line and said second node, said gate being connected to said word line;
    said first node being connected to the gate of said third transistor and to the gate of said fourth transistor;
    said second node being connected to the gate of said first transistor and to the gate of said second transistor;
    the source of said first transistor and the source of said third transistor being connected to a ground line;
    the source of said second transistor and the source of said fourth transistor being connected to a power line;
    the circuit further being provided with a first resistor element and a second resistor element whose resistance values can be electrically modified;
    the positional relationship of said first resistor element and said second resistor element being selected from the following first to fourth positional relationships:
    a first positional relationship in which said first resistor element is connected between the source of said first transistor and said ground line, and said second resistor element is connected between the source of said third transistor and said ground line;
    a second positional relationship in which said first resistor element is connected between the source of said second transistor and said power line, and said second resistor element is connected between the source of said fourth transistor and said power line;
    a third positional relationship in which said first resistor element is connected between said first node and the drain of said first transistor, and said second resistor element is connected between said second node and the drain of said third transistor; and
    a fourth positional relationship in which said first resistor element is connected between said first node and the drain of said second transistor, and said second resistor element is connected between said second node and the drain of said fourth transistor;
    the method comprising:
    a STORE step including a first step wherein the resistance values of said first and second resistor elements are reduced to low levels before power to said non-volatile memory circuit is removed; and a second step, which follows said first step, wherein the resistance value of one of said first and second resistor elements is increased to a high level; and
    a RECALL step wherein voltages are applied to said word line, said first and second bit lines and said power line at a predetermined time after power supply to said non-volatile memory circuit is started.

2. A method for driving the non-volatile memory circuit according to claim 1, in which said RECALL step comprises a step wherein said word line is set at a high voltage level, and the voltages applied to said power line, said first bit line and said second bit line are slowly increased to a supply voltage level.

3. A method for driving the non-volatile memory circuit according to claim 1, in which said RECALL step comprises a step wherein predetermined voltages are applied to said first and second bit lines, and, in this state, said word line is set to a high voltage level, and the voltage applied to said power line is slowly increased to a supply voltage level.

4. A method for driving the non-volatile memory circuit according to claim 1, in which said RECALL step comprises a step wherein predetermined voltages are applied to said first and second bit lines, and, in this state, the voltage applied to the word line is slowly increased to a high level, and the voltage applied to said power line is slowly increased to a supply voltage level.

5. A method for driving the non-volatile memory circuit according to claim 1, which the positional relationship is either of said first positional relationship or said third positional relationship;

said first and second resistor elements comprising a material whose resistance value can be changed by heat generated by an electric current;

the first step further comprising a third step wherein a supply voltage is applied to said first and second bit lines, and, in this state, the voltage of said word line is changed from a low level to a high level, and the voltage of said word line is changed from a high level to a low level after a first period; and the second step further comprising a fourth step wherein the supply voltage is applied to said first bit line, a voltage lower than the supply voltage is applied to said second bit line, and, in this state, the voltage of said word line is changed from a low level to a high level, and then the voltage of said word line is changed from a high level to a low level after a second period.

6. A method for driving the non-volatile memory circuit according to claim 1, in which the positional relationship is either said second positional relationship or said fourth positional relationship;

said first and second resistor elements comprising a material whose resistance value can be changed by heat generated by an electric current;

the first step comprising a third step wherein a ground voltage is applied to said first and second bit lines, and, in this state, the voltage of said word line is changed from a low level to a high level, and then the voltage of said word line is changed from a high level to a low level after a first period; and the second step comprising a fourth step wherein the ground voltage is applied to said first bit line, a voltage higher than the ground voltage is applied to said second bit line, and, in this state, the voltage of said word line is changed from a high level to a low level, and then the voltage of said word line is changed from a high level to a low level after a second period.

7. A method for driving the non-volatile memory circuit according to claim 1, in which the positional relationship is said first positional relationship;

the circuit further comprising a third resistor element and a fourth resistor element; said third resistor element being connected between the source of said second transistor and said power line, and said fourth resistor element being connected between the source of said fourth transistor and said power line;

said first to fourth resistor elements comprising a material whose resistance value can be: changed by heat generated by an electric current;

the first step comprising:

a third step wherein a supply voltage is applied to said first and second bit lines, and, in this state, the voltage of said word line is changed from a low level to a high level, and then the voltage of said word line is changed from a high level to a low level after a first period; and a fourth step wherein a ground voltage is applied to said first and second bit lines, and, in this state, the voltage of said word line is changed from a low level to a high level, and then the voltage of said word line is changed from a high level to a low level after a second period;

the second step comprising:

a fifth step wherein the supply voltage is applied to said second bit line, a voltage lower than the supply voltage is applied to said first bit line, and, in this state, the voltage of said word line is changed from a low level to a high level, and then the voltage of said word line is changed from a high level to a low level after a third period; and a sixth step wherein the ground voltage is applied to said first bit line, a voltage higher than the ground voltage is applied to said second bit line, and, in this state, the voltage of the word line is changed from a low level to a high level, and then the voltage of said word line is changed from a high level to a low level after a fourth period.

* * * * *

UNITED STATES PATENT AND TRADEMARK OFFICE
CERTIFICATE OF CORRECTION

PATENT NO. : 6,847,543 B2
DATED : January 25, 2005
INVENTOR(S) : Kenji Toyoda et al .

It is certified that error appears in the above-identified patent and that said Letters Patent is hereby corrected as shown below:

<u>Title page,</u>
Item [75], Inventors, change "Yawata" to -- Kyoto --

Signed and Sealed this

Seventeenth Day of May, 2005

JON W. DUDAS
*Director of the United States Patent and Trademark Office*

UNITED STATES PATENT AND TRADEMARK OFFICE
CERTIFICATE OF CORRECTION

PATENT NO. : 6,847,543 B2
DATED : January 25, 2005
INVENTOR(S) : Kenji Toyoda et al.

It is certified that error appears in the above-identified patent and that said Letters Patent is hereby corrected as shown below:

<u>Title page,</u>
Item [75], Inventors, change "Yawata" to -- Kyoto --
Item [63], Related U.S. Application Data, insert:
-- [63] Related U.S. Application Data
Continuation of application No. PCT/JP03/06905, filed on June 2, 2003 --

Signed and Sealed this

Seventh Day of June, 2005

JON W. DUDAS
*Director of the United States Patent and Trademark Office*

UNITED STATES PATENT AND TRADEMARK OFFICE
CERTIFICATE OF CORRECTION

PATENT NO. : 6,847,543 B2
APPLICATION NO. : 10/684419
DATED : January 25, 2005
INVENTOR(S) : Kenji Toyoda et al.

Page 1 of 1

It is certified that error appears in the above-identified patent and that said Letters Patent is hereby corrected as shown below:

Column 18, line 65, change "according to claim 1, which" to -- according to claim 1, in which --;

Column 20, line 9, change "whose resistance value can be: changed by heat" to -- whose resistance value can be changed by heat --.

Signed and Sealed this

Seventeenth Day of April, 2007

JON W. DUDAS
*Director of the United States Patent and Trademark Office*